US012641706B1

(12) United States Patent
Monahan et al.

(10) Patent No.: US 12,641,706 B1
(45) Date of Patent: May 26, 2026

(54) THERMAL RISER SYSTEM

(71) Applicant: LiquaCool IP LLC, Lakeside, MT (US)

(72) Inventors: Nicholas J. Monahan, Meadow Vista, CA (US); Clas Sivertsen, Kristiansund (NO)

(73) Assignee: LIQUACOOL IP LLC, Lakeside, MT (US)

( * ) Notice: Subject to any disclaimer, the term of this patent is extended or adjusted under 35 U.S.C. 154(b) by 0 days.

(21) Appl. No.: 19/183,740

(22) Filed: Apr. 18, 2025

(51) Int. Cl.
| | |
|---|---|
| *H05K 1/02* | (2006.01) |
| *F28F 23/00* | (2006.01) |
| *H05K 7/20* | (2006.01) |

(52) U.S. Cl.
CPC .......... H05K 1/0206 (2013.01); F28F 23/00 (2013.01); H05K 7/20218 (2013.01); H05K 7/2039 (2013.01)

(58) Field of Classification Search
CPC ................. H01L 25/0657; H01L 23/36; H01L 2023/4062; H01L 23/34; H05K 7/20218; H05K 7/2039; H05K 7/20254; F28F 23/00
See application file for complete search history.

(56) References Cited

U.S. PATENT DOCUMENTS

| | | | |
|---|---|---|---|
| 4,727,455 A | 2/1988 | Neidig et al. | |
| 4,839,774 A | * 6/1989 | Hamburgen | ......... H05K 1/0272 257/E23.099 |

| | | |
|---|---|---|
| 5,109,318 A | 4/1992 | Funari et al. |
| 5,305,184 A | 4/1994 | Andresen et al. |
| 5,373,417 A | 12/1994 | Barrett |
| 5,880,524 A | 3/1999 | Xie |
| 5,990,418 A | 11/1999 | Bivona et al. |
| 6,052,284 A | 4/2000 | Suga et al. |
| 6,114,048 A | 9/2000 | Jech et al. |
| 6,175,501 B1 | 1/2001 | Bortolini et al. |
| 6,208,511 B1 | 3/2001 | Bortolini et al. |
| 6,227,286 B1 | 5/2001 | Katsui |
| 6,304,447 B1 | 10/2001 | Bortolini et al. |

(Continued)

FOREIGN PATENT DOCUMENTS

| | | |
|---|---|---|
| CN | 205987529 U | 2/2017 |
| CN | 116913872 A | 10/2023 |

(Continued)

OTHER PUBLICATIONS

CN 205987529 U Original (Year: 2016).

(Continued)

*Primary Examiner* — Adam B Dravininkas
(74) *Attorney, Agent, or Firm* — Nicholson De Vos Webster & Elliott LLP; Judith Szepesi

(57) ABSTRACT

A cooling system used with a component on a printed circuit board is described. The cooling system comprises a thermal riser having a top including a plurality of thermal riser pads to receive interconnections on a bottom of the component, a bottom including a plurality of bottom connectors configured to be coupled to traces on the printed circuit board, pins coupling each thermal riser pad to a corresponding bottom connector, the pins being electrically conductive, and a transfer fluid within the thermal riser, the transfer fluid in contact with the pins to cool the interconnections of the component, and thereby cool a bottom of the component.

22 Claims, 24 Drawing Sheets

(56) References Cited

U.S. PATENT DOCUMENTS

| | | | |
|---|---|---|---|
| 6,665,187 | B1 | 12/2003 | Alcoe et al. |
| 7,124,806 | B1 | 10/2006 | Wang et al. |
| 7,433,188 | B2 * | 10/2008 | Miller ................ G01R 31/2863 |
| | | | 361/689 |
| 7,538,425 | B2 | 5/2009 | Myers et al. |
| 10,542,640 | B1 | 1/2020 | Leigh et al. |
| 10,687,441 | B2 | 6/2020 | Parnes et al. |
| 11,365,906 | B2 | 6/2022 | Eadelson |
| 11,647,607 | B2 | 5/2023 | Dogruoz et al. |
| 11,705,437 | B1 | 7/2023 | Deng et al. |
| 11,778,783 | B2 | 10/2023 | Eadelson |
| 12,018,893 | B2 | 6/2024 | Eadelson |
| 12,022,639 | B2 | 6/2024 | Liu et al. |
| 12,245,360 | B2 | 3/2025 | Mohr et al. |
| 2001/0023759 | A1 | 9/2001 | Katsui |
| 2002/0062648 | A1 | 5/2002 | Ghoshal |
| 2003/0123225 | A1 * | 7/2003 | Miller ................ H05K 7/20236 |
| | | | 257/714 |
| 2003/0184972 | A1 | 10/2003 | Saeki et al. |
| 2006/0007655 | A1 | 1/2006 | Symons |
| 2006/0034052 | A1 | 2/2006 | Chang et al. |
| 2007/0109739 | A1 | 5/2007 | Stefanoski |
| 2007/0132479 | A1 * | 6/2007 | Fenk .................. G01R 31/2862 |
| | | | 324/763.01 |
| 2008/0000087 | A1 * | 1/2008 | Kuczynski .......... H05K 1/0272 |
| | | | 257/E23.098 |
| 2009/0057881 | A1 | 3/2009 | Arana et al. |
| 2010/0147492 | A1 | 6/2010 | Conry |
| 2011/0002102 | A1 | 1/2011 | Brok et al. |
| 2011/0134610 | A1 | 6/2011 | Baur et al. |
| 2012/0063094 | A1 | 3/2012 | Gaynes et al. |
| 2012/0085520 | A1 | 4/2012 | Pfaffinger |
| 2012/0099274 | A1 | 4/2012 | Winter |
| 2012/0111553 | A1 * | 5/2012 | Tsoi ................... H05K 7/20245 |
| | | | 165/185 |
| 2012/0127661 | A1 | 5/2012 | Brok et al. |
| 2012/0133051 | A1 | 5/2012 | Knickerbocker et al. |
| 2012/0228779 | A1 | 9/2012 | King, Jr. et al. |
| 2014/0124174 | A1 | 5/2014 | Campbell et al. |
| 2014/0318169 | A1 | 10/2014 | Wits et al. |
| 2014/0362552 | A1 * | 12/2014 | Murayama ........... H05K 1/0272 |
| | | | 361/783 |
| 2015/0098200 | A1 | 4/2015 | Spangberg |
| 2015/0109735 | A1 | 4/2015 | Campbell et al. |
| 2015/0131224 | A1 | 5/2015 | Barina et al. |
| 2015/0234437 | A1 | 8/2015 | Gallina et al. |
| 2016/0020160 | A1 * | 1/2016 | Buvid .................. H01L 23/367 |
| | | | 257/784 |
| 2016/0073548 | A1 | 3/2016 | Wei et al. |
| 2016/0081178 | A1 | 3/2016 | D'Onofrio |
| 2017/0295670 | A1 | 10/2017 | Campbell et al. |
| 2018/0090417 | A1 | 3/2018 | Gutala et al. |
| 2018/0157296 | A1 | 6/2018 | Aoki et al. |
| 2018/0288906 | A1 | 10/2018 | Hopton et al. |
| 2019/0269004 | A1 | 8/2019 | Mitsui |
| 2020/0315059 | A1 | 10/2020 | Gao |
| 2021/0064107 | A1 | 3/2021 | Bender et al. |
| 2021/0087967 | A1 | 3/2021 | Louco et al. |
| 2021/0130970 | A1 | 5/2021 | Desalvo et al. |
| 2021/0134646 | A1 * | 5/2021 | Or-Bach ............... H01L 23/544 |
| 2021/0321526 | A1 | 10/2021 | Kulkarni et al. |
| 2022/0117080 | A1 | 4/2022 | Geng et al. |
| 2022/0187023 | A1 | 6/2022 | Kang |
| 2022/0230937 | A1 | 7/2022 | Malouin et al. |
| 2022/0316764 | A1 | 10/2022 | Eadelson |
| 2022/0338375 | A1 | 10/2022 | Mizerak et al. |
| 2022/0341860 | A1 | 10/2022 | Fitch et al. |
| 2022/0354011 | A1 | 11/2022 | Hadwan et al. |
| 2022/0354026 | A1 | 11/2022 | Kelley et al. |
| 2023/0317555 | A1 | 10/2023 | Yangyang et al. |
| 2024/0038632 | A1 | 2/2024 | Prajuckamol et al. |
| 2024/0057246 | A1 | 2/2024 | Gupta et al. |
| 2024/0147676 | A1 | 5/2024 | Takata |
| 2025/0071938 | A1 | 2/2025 | Yang et al. |

FOREIGN PATENT DOCUMENTS

| | | | |
|---|---|---|---|
| CN | 220122869 | U | 12/2023 |
| CN | 117946621 | A | 4/2024 |
| DE | 202010014106 | U1 | 12/2010 |
| EP | 0191419 | A2 | 8/1986 |
| EP | 0709884 | A2 | 5/1996 |
| EP | 2769601 | A1 | 8/2014 |
| EP | 3229571 | A2 | 10/2017 |
| EP | 3629691 | A1 | 4/2020 |
| IT | UB20155887 | A1 | 5/2017 |
| JP | 57-104538 | U | 6/1982 |
| JP | 01-230971 | A | 9/1989 |
| JP | 03-067446 | U | 7/1991 |
| JP | 04-129255 | A | 4/1992 |
| JP | 11-045967 | A | 2/1999 |
| JP | 2002-043488 | A | 2/2002 |
| JP | 2023-004440 | A | 1/2023 |
| KR | 10-0369717 | B1 | 6/2003 |
| KR | 10-1741079 | B1 | 5/2017 |
| TW | M648455 | U | 11/2023 |
| WO | 2007/046221 | A1 | 4/2007 |
| WO | 2018/025016 | A1 | 2/2018 |
| WO | 2024/243146 | A1 | 11/2024 |

OTHER PUBLICATIONS

Middelhuis, M. et al., "Analysis and experimental validation of a pumped two-phase loop for multi-component electronics cooling," Heat Mass Transfer, vol. 60, Nov. 15, 2023, pp. 305-327.

Terpstra, J. et al., "Improving Thermal Contact Conductance from Electronics Board to Rack Infrastructure," 24rd International Workshop on Thermal Investigations of ICs and Systems (THERMINIC), Stockholm, Sweden, Sep. 2018, pp. 1-6.

Wits, W. et al., "Experimental Performance of a 3D-Printed Hybrid Heat Pipe-Thermosyphon for Cooling of Power Electronics," 24rd International Workshop on Thermal Investigations of ICs and Systems (THERMINIC), Stockholm, Sweden, Sep. 2018, pp. 1-6.

Zwier, M.P., "Modelling and experimental investigation of a thermally driven self-oscillating pump," Applied Thermal Engineering, vol. 126, Nov. 5, 2017, pp. 1126-1133.

* cited by examiner

Thermal Riser
210

Transfer
Fluid Connection
230

Riser Casing
220

Riser
Solder balls
270

Riser Pads
250

Pins providing Connection
Between Component and PCB traces
260

Transfer Fluid
240

Transfer
Fluid Connection
230

Thermal Riser
210

Positioning
Component
280

Thermal Riser
Inlet/Outlet
225

Riser Casing
220

Transfer fluid
240

Connectors Matched to
Component
282

Thermal Riser
Inlet/Outlet
225

THERMAL RISER SYSTEM

FIELD

The present application relates to thermal management systems, specifically to a thermal riser system which provides cooling to the bottom of a component.

BACKGROUND

Integrated circuits (ICs) such as central processing units (CPUs), systems on a chip (SOCs), graphics processors (GPUs), tensor processing units (TPUs), neural processing units (NPUs), field-programmable gate arrays (FPGAs), and application-specific integrated circuits (ASICs), power transistors, DC-DC converters, power controllers with integrated switching transistors, triacs, thyristors, diode bridge rectifiers, insulated-gate bipolar transistors (IGBTs), voltage regulators, motor drivers, power factor correction (PFC) circuits, load switches, and others produce heat during operation. These components must be adequately cooled to maintain optimal performance and prevent failure.

In the prior art, various heat dissipation methods have been employed to absorb and remove heat from the ICs and redistribute it away from the hardware.

Traditionally, cooling methods have relied on a combination of heat sinks and fans, where air is moved across the heatsink to dissipate heat. However, such methods are often insufficient for managing the thermal demands of modern, high-performance components.

One prior art solution is liquid cooling. In this system, rather than air, a liquid such as water or a specialized dielectric fluid circulates to remove heat. The system generally consists of a baseplate connected to the metal lid of a CPU via thermal paste. The baseplate forms part of a water block that is filled with coolant. As the coolant absorbs heat from the baseplate, it is transferred through the water block and then routed to a radiator. At the radiator, the liquid is exposed to air for cooling, with fans often used to accelerate heat removal. The coolant then re-enters the water block, completing the cycle.

Semiconductor components exhibit a characteristic known as thermal runaway; wherein power consumption increases exponentially with rising temperature. As the die temperature rises, the power required to perform the same computational operations increases, exacerbating the thermal load. Without efficient heat removal, this thermal runaway can escalate, leading to critical temperature levels in semiconductor systems.

Traditionally, cooling semiconductor dies involve two approaches. The first involves heat dissipation through the top surface of the die, with thermal paste bridging the die to a metal heatsink, which is cooled by air or liquid. The second approach leverages ground pads connected to the package via gold wires, which are linked to the printed circuit board (PCB). This allows some heat to be transferred from the die through pins or balls to the PCB. Though relatively inefficient, even these incremental contributions help alleviate heat in high-performance systems.

The combined effect of these traditional cooling methods is in line with the principle of superposition, where every thermal gradient-any interface or material transition where temperature differences exist-contributes to reducing the internal temperature of the semiconductor die. Nevertheless, even with state-of-the-art conductive cooling techniques, high-performance semiconductor devices often exhibit internal die temperatures exceeding 100° C. in ambient environments of 30° C.

To further manage die temperature, many systems incorporate thermal sensors that monitor temperature levels and initiate throttling or other thermal management strategies when critical thresholds are approached.

While immersion cooling has been practiced for many years in the electronics industry, it presents several drawbacks because entire motherboards or subassemblies must be submerged in a liquid bath. In such configurations, interconnects, such as wires and cables, must exit the liquid, leading to complex and often cumbersome installations. Additionally, the need for large volumes of liquid makes the system expensive, prone to liquid loss through evaporation, and difficult to manage.

BRIEF DESCRIPTION OF THE FIGURES

The present invention is illustrated by way of example, and not by way of limitation, in the figures of the accompanying drawings and in which like reference numerals refer to similar elements and in which.

DETAILED DESCRIPTION

The present invention describes a micro thermal management system which includes a thermal riser coupled between a component and a substrate. The thermal riser includes a transfer fluid, which provides cooling to the pins in the thermal riser, which are electrically and thermally coupled to the interconnection pins on a bottom of the component. The transfer fluid has a high heat transfer coefficient (is thermally highly conductive) but is not electrically conductive (i.e., is electrically insulating). The transfer fluid may be a single phase or a two-phase fluid (changing from liquid to gas at a known temperature). The micro thermal management ((TM) system provides chip level cooling and may be used to cool one or more components on a printed circuit board. Because the thermal riser is coupled between the component and the substrate, the system provides cooling to the bottom of the component.

In various configurations, the transfer fluid flows through the thermal riser, and through an external cooler. In various configurations, the component may further be enclosed within a chamber. In some configurations, the transfer fluid circulates around the chamber and the thermal riser but does not exit the chamber. In some other configurations, the transfer fluid exits the chamber and is cooled outside the chamber. In some configurations, the enclosure forming the chamber may further include a heat exchanger, through which coolant may pass. The coolant may be kept separated from the transfer fluid and cooled outside the system.

In various configurations, the thermal riser may be paired with a heat exchanger. The heat exchanger may be placed on top of the component being cooled. The heat exchanger may be a traditional heatsink, in various embodiments. In other embodiments, the heat exchanger may include a coolant path which provides additional cooling to the top of the component.

Thus, the present application describes a thermal riser system, which includes a thermal riser and may include other elements to provide cooling to a component which produces heat. The entire thermal riser system may be referred to as a system providing micro thermal management, to provide component-level cooling.

The following detailed description of embodiments of the invention make reference to the accompanying drawings in which like references indicate similar elements, showing by way of illustration specific embodiments of practicing the invention. Description of these embodiments is in sufficient detail to enable those skilled in the art to practice the invention. One skilled in the art understands that other embodiments may be utilized, and that logical, mechanical, electrical, functional, and other changes may be made without departing from the scope of the present invention. The following detailed description is, therefore, not to be taken in a limiting sense, and the scope of the present invention is defined only by the appended claims.

Figures 1A, 1B:
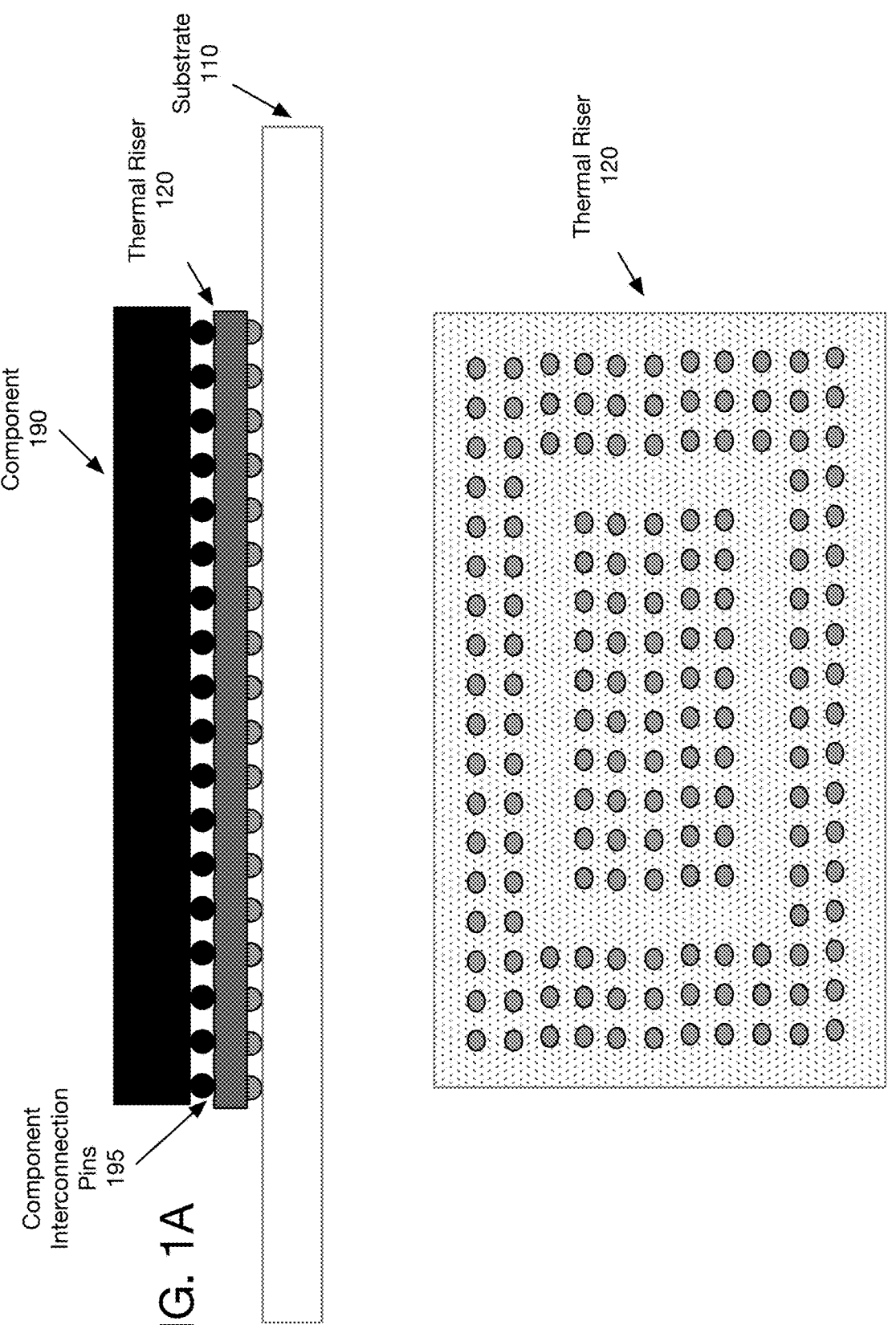
FIGS. 1A and 1B are a side view and a top view of a thermal riser between a component and a printed circuit board.

FIGS. 1A and 1B are a side view and a top view of a thermal riser between a component and a printed circuit board. The thermal riser 120 is positioned between the component 190 and the printed circuit board (PCB) 110. The thermal riser 120 has pins coupled to each of the component interconnection pins 195 of the component 190. The component interconnection pins 195 may be BGA (ball grid array) connectors as illustrated, or other types of connectors designed to be coupled to pads on the PCB 110. The thermal riser 120 provides pins which connect the connectors to the pads. The pins, in some embodiments, may be copper. In some embodiments, the pins may be gold plated. The pins, in some other embodiments may be of another highly conductive material.

The interior of thermal riser 120 includes a transfer fluid, which provides cooling to the component interconnection pins 195, and thus to the bottom of the component 190. In various embodiments, the transfer fluid may flow through the thermal riser 120 in various ways. In some embodiments, the thermal riser is between 1 mm and 30 mm high and sized for the component. For larger components, or in some special cases, the size of the thermal riser may be larger or smaller, as needed to provide the appropriate level of cooling for the component. While the substrate 110 illustrated is only slightly larger than the thermal riser, this is merely for simplicity of illustration. A typical substrate may be many times larger and may include multiple components with associated thermal risers. The substrate may be a printed circuit board (PCB), a flexible board, flexible material, 3D electronics support structure, laser direct structuring (LDS) material, or another element which provides pads for component attachment.

In some embodiments, thermal risers 120 may be used with any heat producing component on a substrate, such as central processing units (CPUs), systems on a chip (SOCs), graphics processors (GPUs), tensor processing units (TPUs), neural processing units (NPUs), field-programmable gate arrays (FPGAs), application-specific integrated circuits (ASICs), accelerated processing units (APUs), thermal imager, charge coupled device (CCD), and CMOS (complementary metal-oxide semiconductor) sensors, solid state drives (SSDs), quantum computer chips, memories, and/or other components. The component may further be a module, such as an artificial intelligence (AI) accelerator module. Such a module may be compliant with M.2 (Next Generation Form Factor) standards. A single PCB or substrate may include one or more CPUs, one or more GPUs, and memories some or all of which may have an associated thermal riser 120 positioned between the component and the substrate. The substrate may be the substrate of a module such as the AI accelerator module. The component may also be another type of component, such as a graphics card or battery, in which the thermal riser is placed at the power connector, to cool the plug and connection.

Figures 1C, 1D:
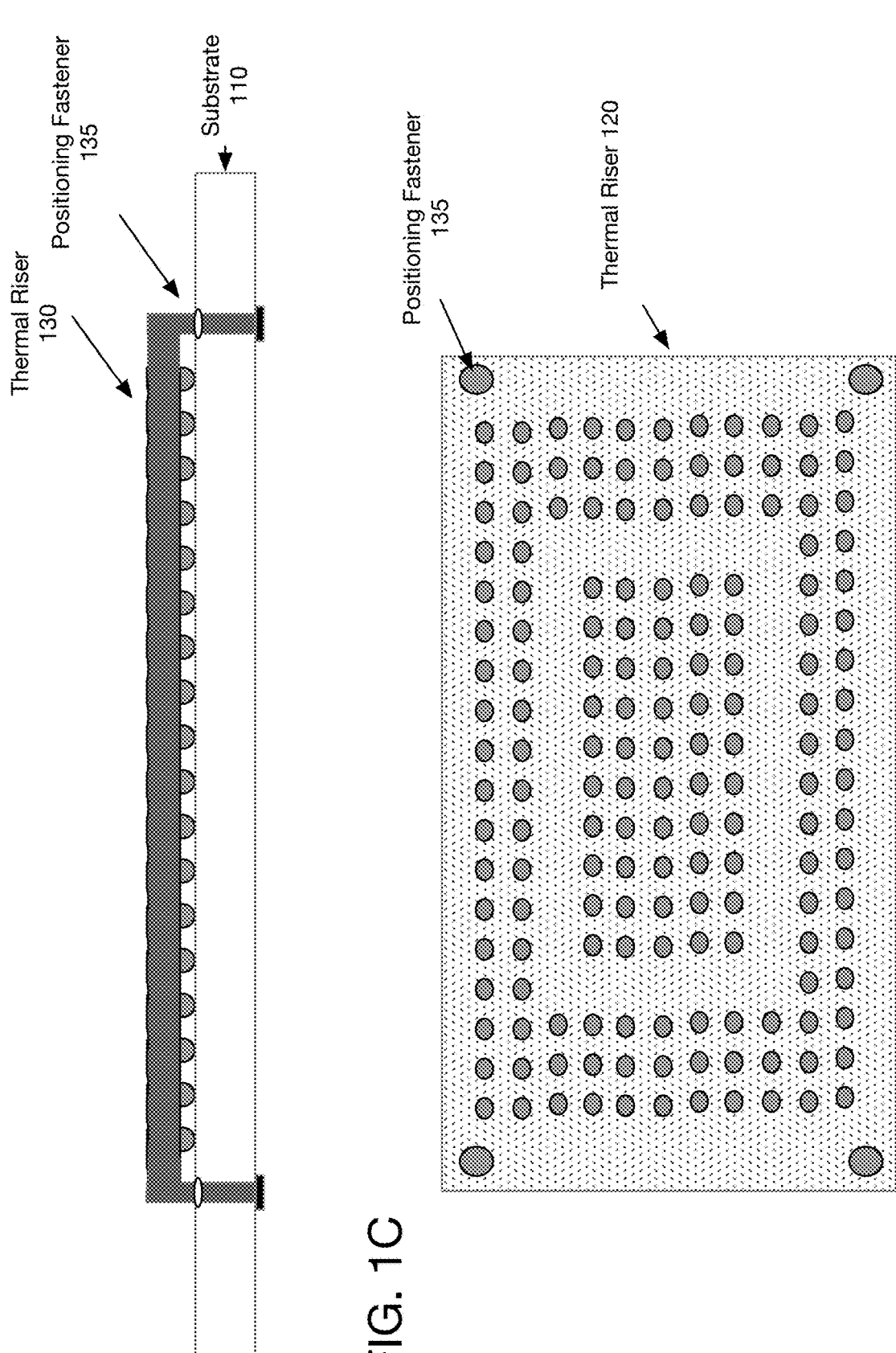
FIGS. 1C and 1D are a side view and a top view of the thermal riser with a positioning fastener.

FIGS. 1C and 1D are a side view and a top view of the thermal riser with positioning fasteners. In this configuration, the thermal riser 130 includes integral positioning fasteners 135. The positioning fasteners fit into holes in the PCB 110. This ensures that the bottom connectors of the thermal riser are aligned with the pads on the substrate for the component supported by the thermal riser. The positioning fasteners 135 may be in the four corners of the thermal riser 130, in various embodiments. Alternatively, the positioning fastener 135 may include fewer or more elements. In some configurations, only two positioning fasteners 135 may be used. In other configurations, more than four such fasteners 135 may be used.

Figures 1E, 1F:
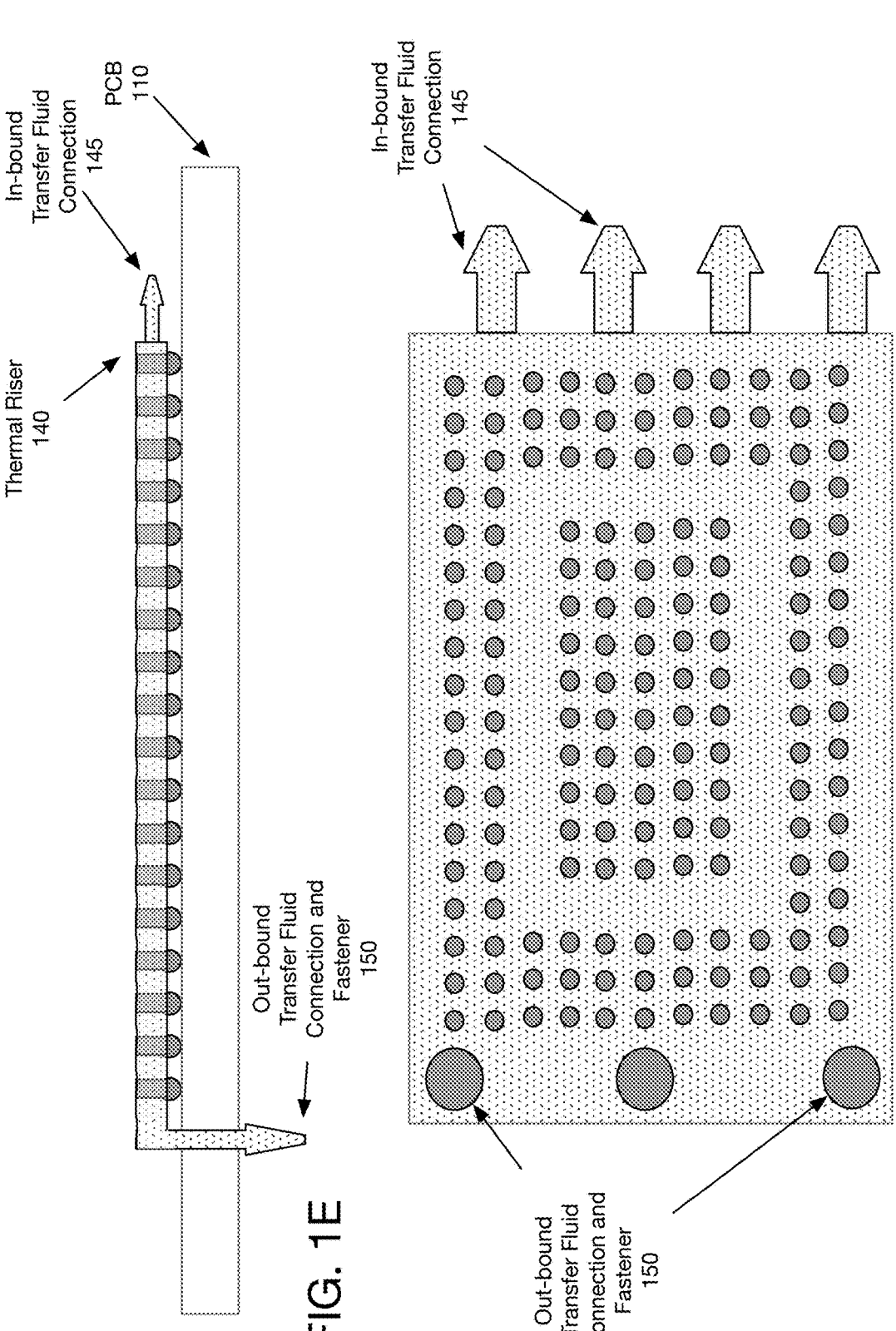
FIGS. 1E and 1F are a side view and a top view of the thermal riser with flow through a cooling fluid connection.

FIGS. 1E and 1F are a side view and a top view of the thermal riser with flow through a transfer fluid connection. In this configuration, the thermal riser 140 includes an in-bound transfer fluid connection 145, and an out-bound transfer fluid connection/fastener. The transfer fluid flows through the thermal riser 140, and through a cooler (not shown). The transfer fluid may flow in a loop, being cooled outside the thermal riser, and then passed back through the in-bound transfer fluid connection 145. The transfer fluid may be moved in the loop using a pump. The out-bound transfer fluid connection and fastener 150 provides a path for the transfer fluid, through the PCB 110/substrate. The output transfer fluid connection and fasteners 150 also acts as a positioning fastener to accurately position the thermal riser 140 on the PCB and fasten it in place. In various embodiments, in addition to the output transfer fluid connection and fasteners 150 there may be other positioning fasteners on another side of the thermal riser 140. While four in-bound transfer fluid connections 145 and three out-bound transfer fluid connections 150 are shown, it should be understood that the number of connections may vary from one each to more than four, depending on the size of the thermal riser 140 and the volume of transfer fluid used for cooling. In various embodiments, the specific configuration of the in-bound and out-bound connections are set based on an expected temperature range of the component supported, a number of pins in the thermal riser, and a size of the thermal riser. Furthermore, although the inbound and outbound connections are illustrated as a plumbing connection, one of skill in the art would understand that the connection may have any shape or format.

Figure 2A:
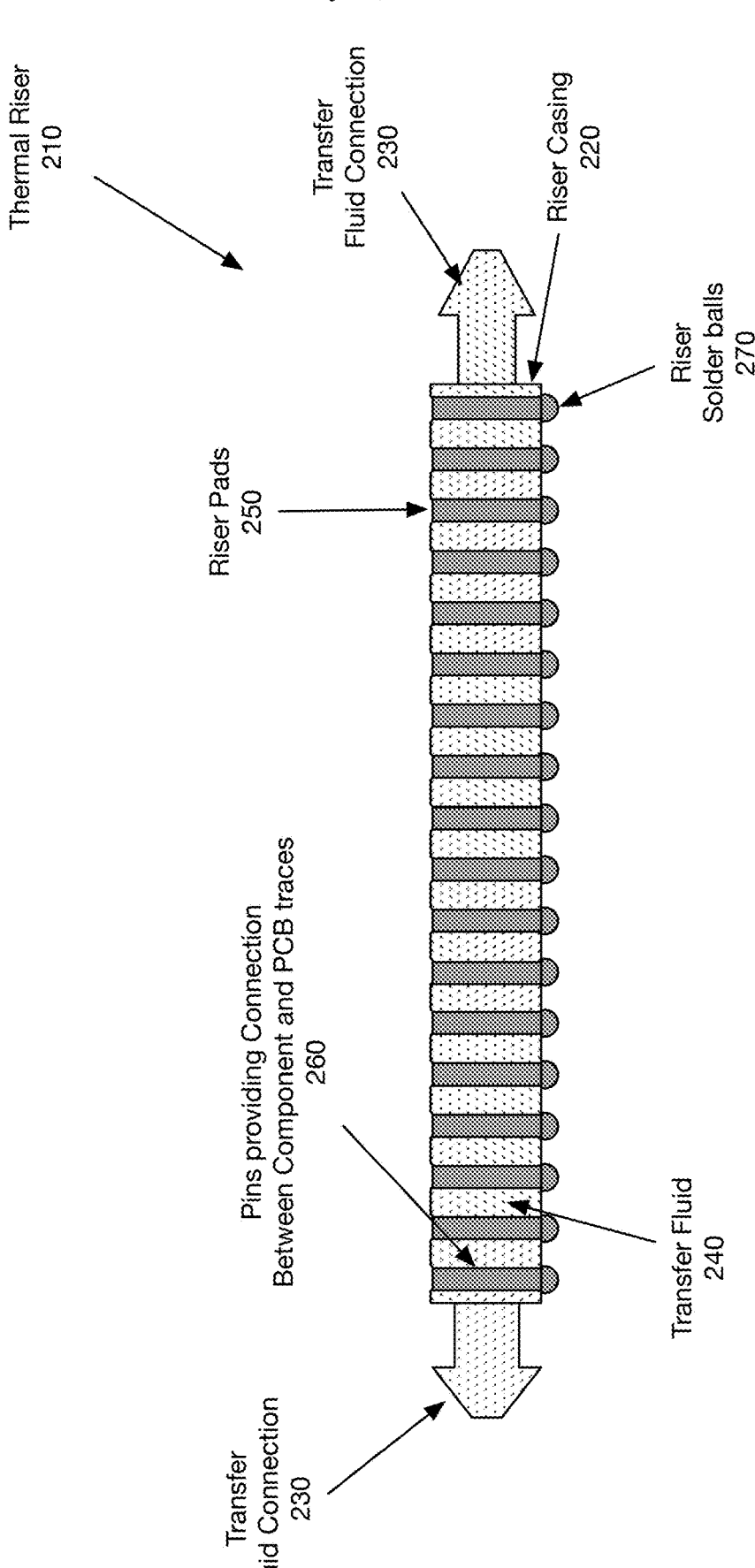
FIGS. 2A and 2B are a cross-section view and a top view one configuration of the thermal riser with a cooling fluid connection.
Figure 2B:
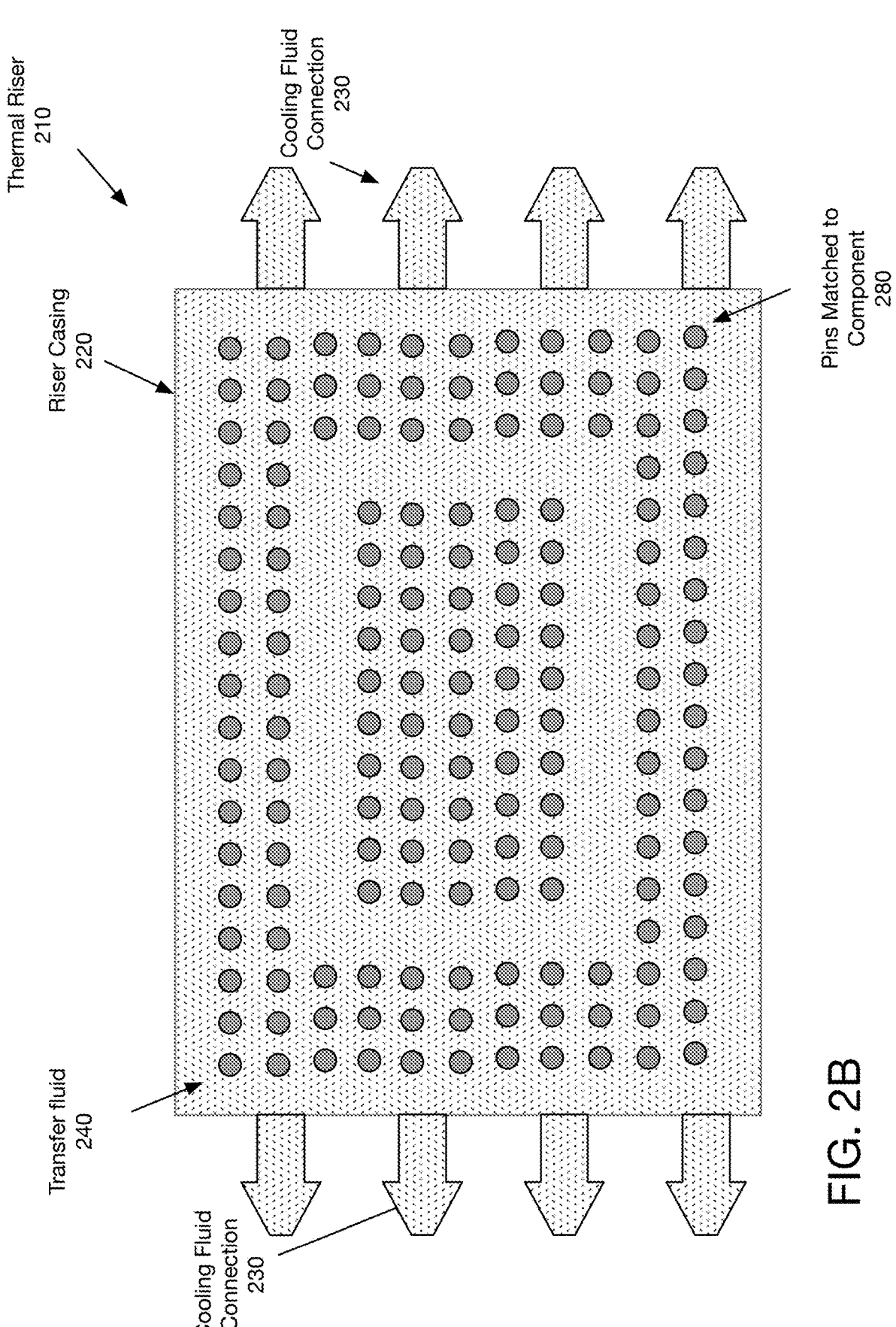

FIGS. 2A and 2B are a cross-section view and a top view one configuration of the thermal riser with a transfer fluid connection. The cross-section view shows the pins 260 which allow the thermal riser 210 to create a connection between the component (not shown) and the substrate which may be a printed circuit board (not shown). The transfer fluid 240 flows through the thermal riser 210, through transfer fluid connections 230, and across pins 260. The pins 260 include a top portion extending beyond the thermal riser casing 220, which form thermal riser pads 250, and a bottom portion which are the thermal riser solder balls 270. The thermal riser is designed for a component, with the thermal riser pads 250 matched to the interconnection pins of the component. The interconnection pins of the component are permanently coupled to the thermal riser pads 250 during assembly in various embodiments. The thermal riser solder balls 270 are designed to be placed on the pads on the PCB and permanently coupled to the pads on the PCB. This may be done using standard solder reflow techniques and may be done concurrently with the thermal riser solder balls being coupled to the pads on the substrate. Thus, the thermal riser 210 becomes a permanent part of the assembly. There is transfer fluid 240 within the thermal riser, providing cooling through the pins 260 to the component. The positioning of the pins 260 is matched to the component. Although the examples shown illustrate a component with a BGA-type mounting system, the present system can be used with other types of surface-mounted chips as well.

Figure 2C:
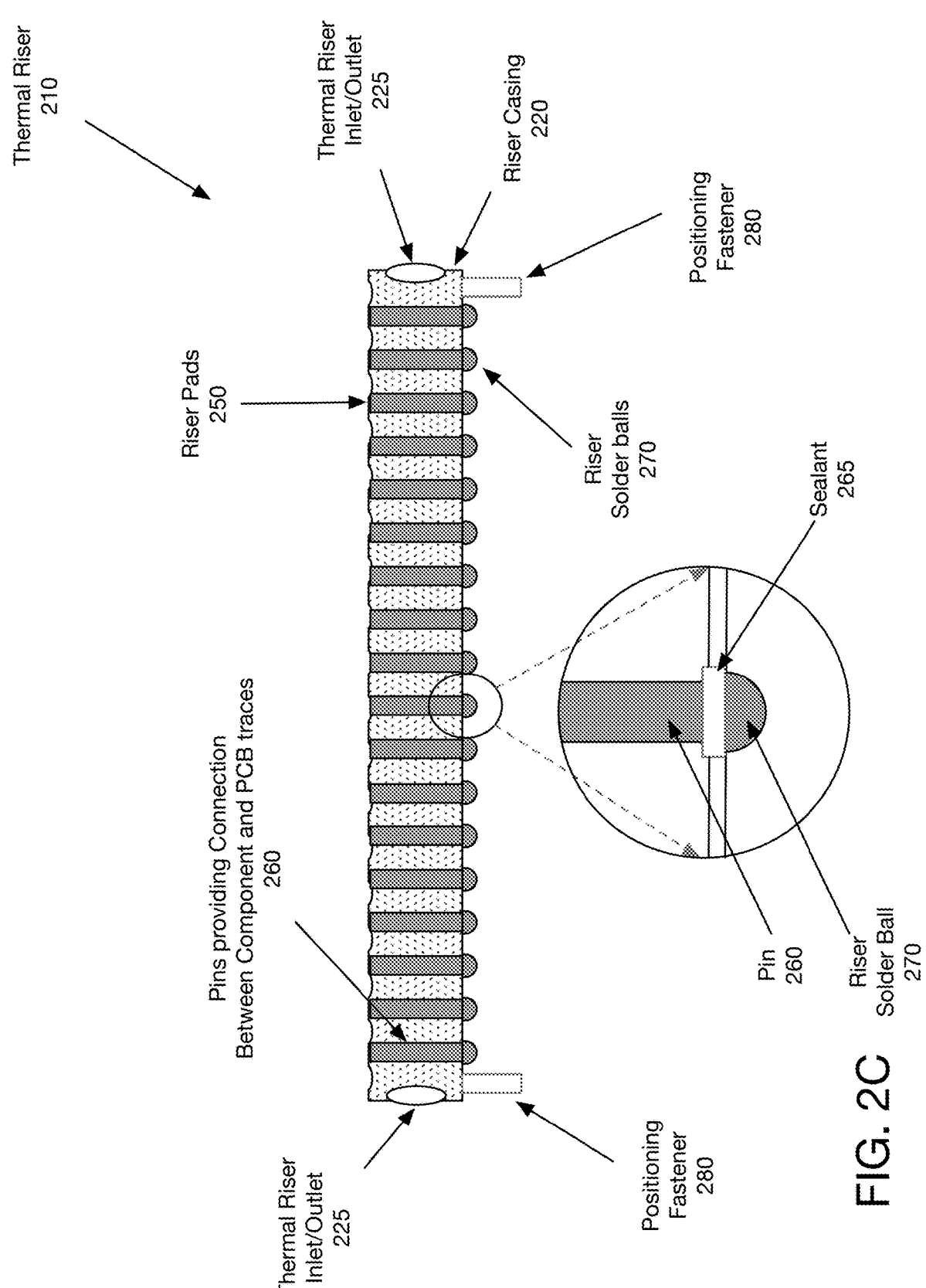
FIGS. 2C and 2D are a cross-section view and a top view of a configuration of the thermal riser with a positioning fastener.
Figure 2D:
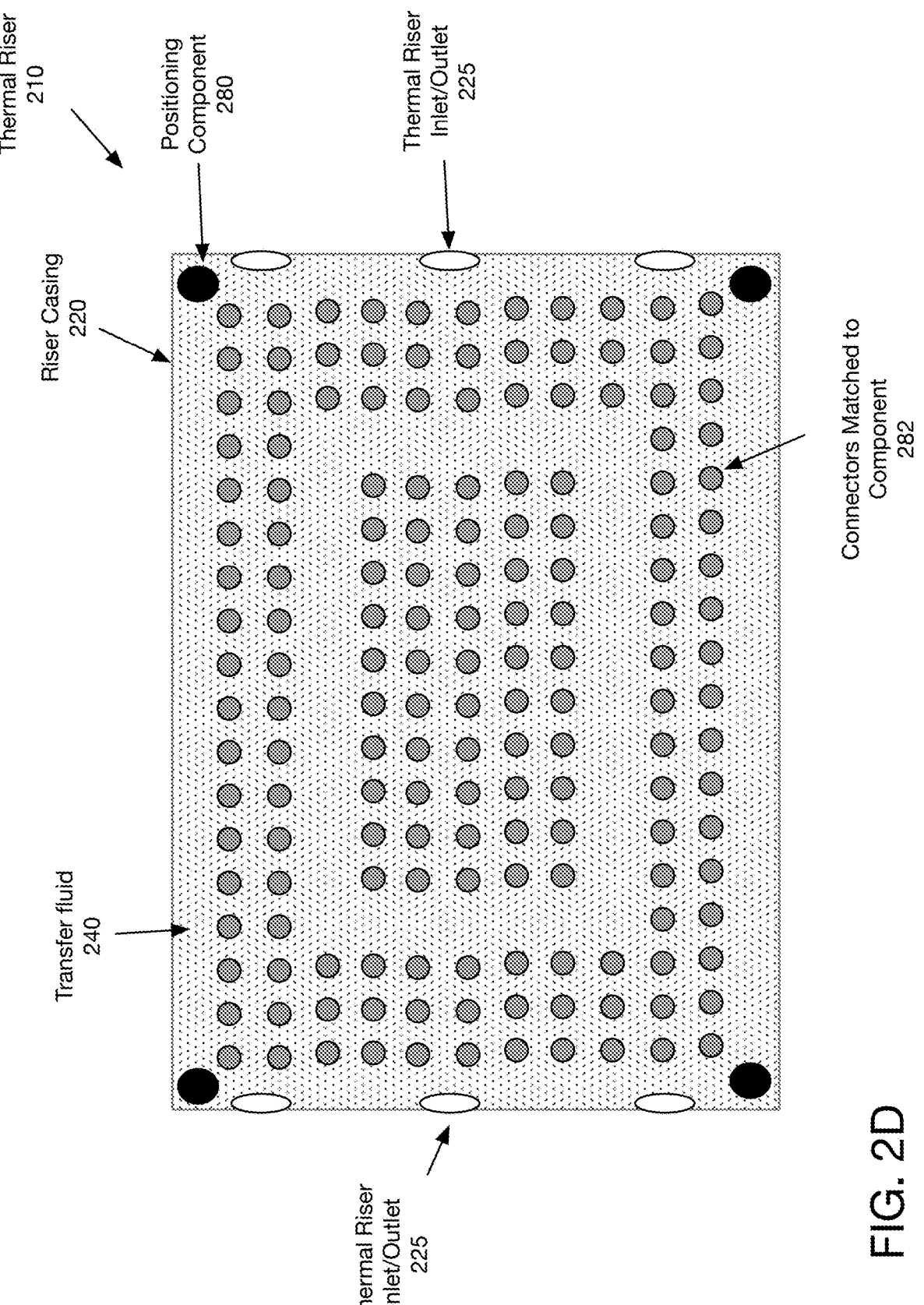

FIGS. 2C and 2D are a cross-section view and a top view of a configuration of the thermal riser with a positioning fastener. This configuration illustrates positioning fasteners 280 which are used to position the thermal riser 210 on the printed circuit board. The positioning fasteners may be parts sized to fit vias in the printed circuit board. Alternatively, they may be screws, bolts, or other types of attachments. In various configurations including the positioning fasteners 280, the thermal riser 210 may not be soldered to the printed circuit board. Rather, the attachment may be via the positioning fasteners 280. The thermal riser 210 includes a riser casing 220 which provides support for the pins 260, which include riser pads 250 to engage with the component, and riser solder balls 270 to engage with pads on a substrate. Thermal fluid travels through the thermal riser 210 and enters/exits the thermal riser 210 through thermal riser inlet/outlet 225. In various embodiments, the inlet/outlet 225 may include O-rings or other components for sealing a hose or other connection which carries the thermal fluid.

There may be a sealant 265 surrounding the tops and bottoms of the pins 260 at both the top and bottom of the thermal riser casing 220, to provide a leak-proof thermal riser.

Figure 2E:
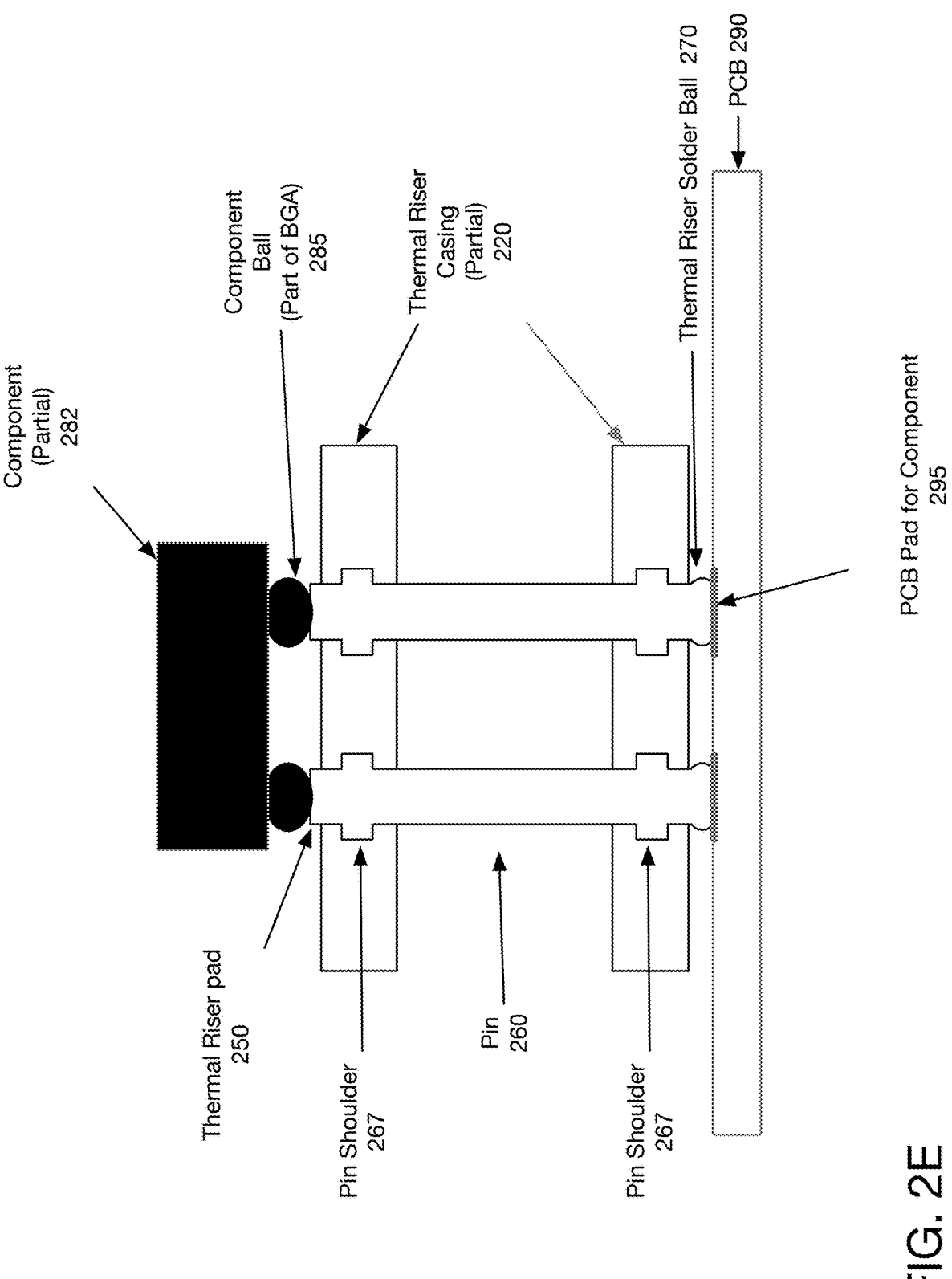
FIG. 2E is an exemplary cross-section of a thermal riser with a pin, illustrating the coupling of the pins to thermal riser casing to lock in the pins and prevent leakage.

FIG. 2E is an exemplary cross-section of a portion of a thermal riser with two pins shown, illustrating one embodiment of the coupling and sealing of the pins to of thermal riser casing to lock in the pins and prevent leakage. The thermal riser casing 220 encloses the tops and bottoms of pins 260. The pins 260 include a pin shoulder 267, which is encased within the casing 220. The pin shoulders lock the pins into place within the casing. The shape of the pin shoulders 267 is arbitrary. The encasing of the pins 260 provides leak protection. The thermal riser pad 250 portion of the pin extends above the top of the thermal riser casing and is the support for the component solder balls 285 which are part of the ball grid array of the component 282. On the bottom of the casing 220, the thermal riser solder balls 270 extend beyond the casing of the thermal riser and are in contact with the PCB pads 295 on the PCB 290. Transfer fluid flows through the central portion of the thermal riser 210. This allows the thermal riser to provide connectivity and cooling.

Figure 3:
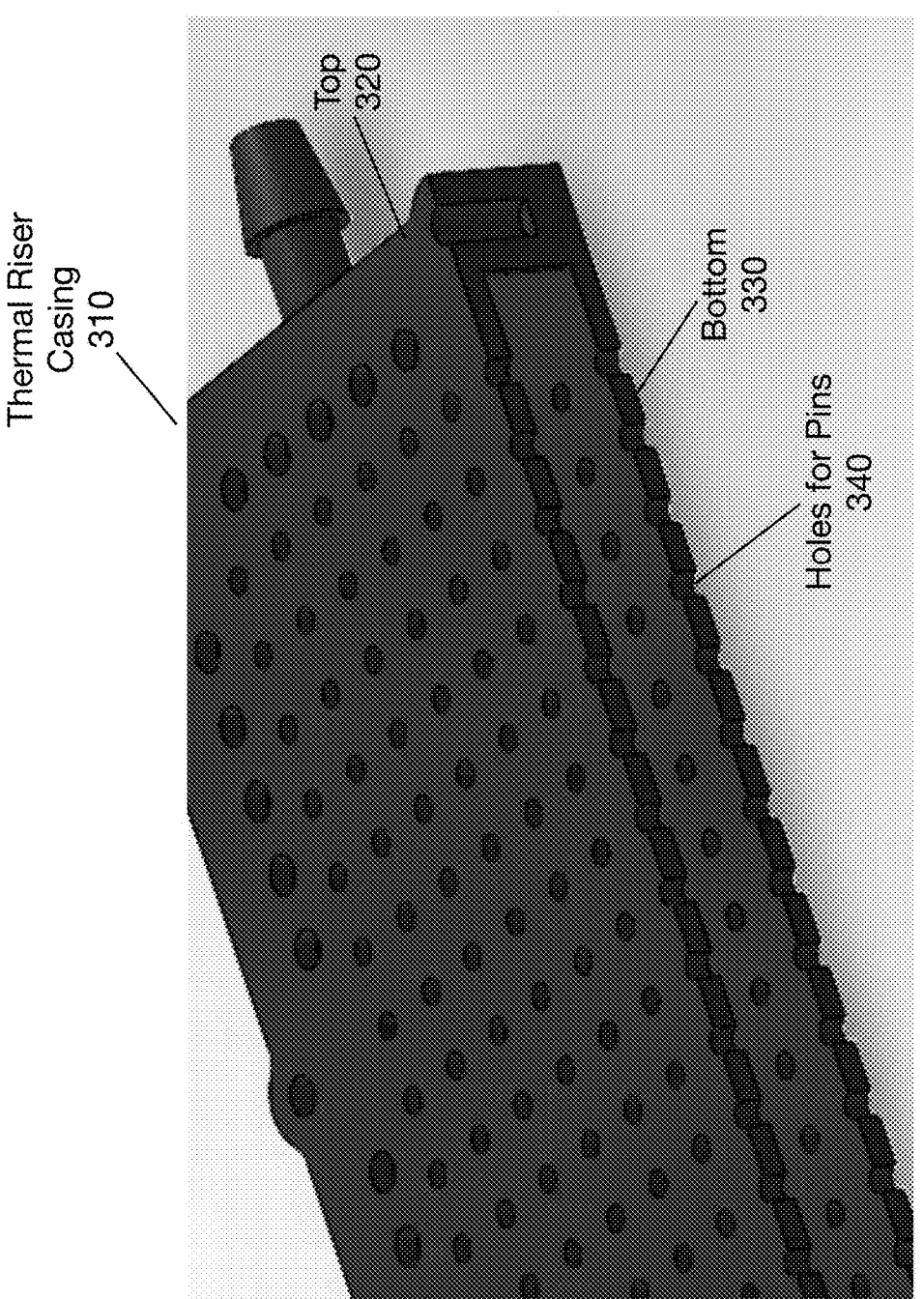
FIG. 3 is an image of a crosscut of a thermal riser casing, showing the holes for the pins.

FIG. 3 is an image of a crosscut of a thermal riser casing, showing the holes for the connections. The thermal riser casing 310 may be made of a non-conductive material such as thermoplastic. The thermoplastic may be for example polyetheretherketone (PEEK) or polyimide. Other materials may be used, as long as they can be made liquid-tight, and are non-conductive. The thermal riser casing 310 provides the locations for the pins (not shown) with holes 340, at the top 320 and bottom 330 of the thermal riser casing 310. The thermal riser casing may include sealant around the pad and ball of each pin in various embodiments. In various alternative embodiments, the entire thermal riser may be within the leak-proof enclosure, and the sealant may be omitted. The thermal riser casing 310 may include side walls (not shown) or may omit side walls if the thermal riser is within an enclosure, as discussed in more detail below. This configuration shows a transfer fluid connection in the shape of a plumbing connection. In other configurations, the transfer fluid connections may be different.

Figures 4A, 4B:
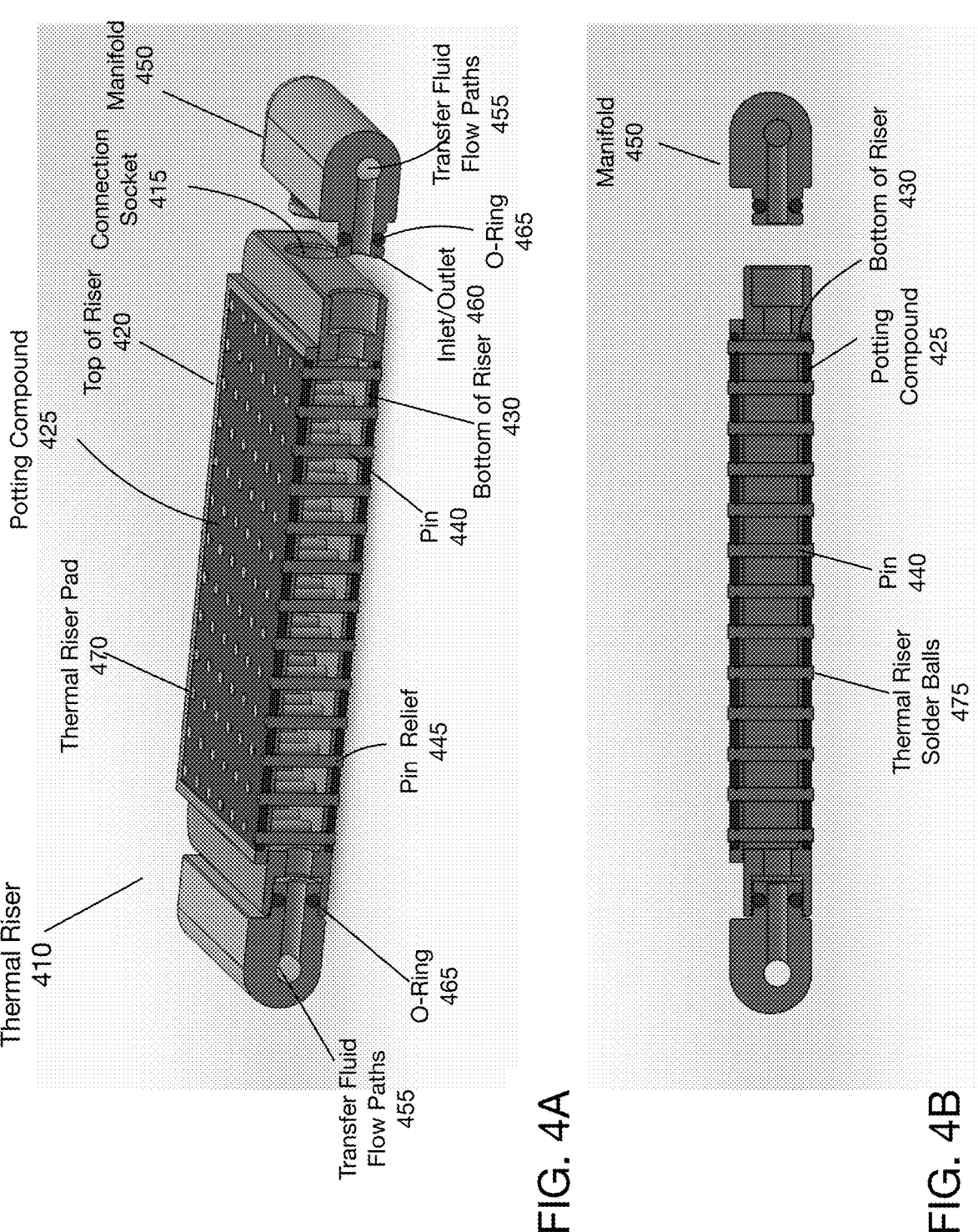
FIGS. 4A and 4B are cross-section views of a configuration of the thermal riser with a potting compound to prevent leakage and secure the pins.

FIGS. 4A and 4B are cross-section views of a configuration of the thermal riser with a potting compound to prevent leakage and secure the pins in place. The thermal riser 410 includes a top 420 and bottom 430, and pins 440 coupling the top and bottom. The top 420 and bottom 430 of the thermal riser 410 are recessed, and there is a potting compound in the recessed area, which holds the pins 440 in place and ensures that the thermal fluid within the thermal riser 410 does not leak. The potting compound 425 may be an epoxy resin or another material which affixes the pins 440 and creates a leak-proof thermal riser 410. The pins may include a pin relief 445 in-set, which ensures that the pins are securely held by the potting compound. The specific configuration of the pin relief 445 is arbitrary. The tops of the pins, forming the thermal riser pads 470 to which the connections of a component are coupled extend from the potting compound 425. The bottoms of the pins, forming the thermal riser solder balls 475 for coupling the thermal riser 410 to the substrate also extend from the potting compound 425. The potting compound 425 is semi-flexible, heat resistant, and provides sealing, in various embodiments.

The thermal riser 410 includes a connection socket 415 to which a part that brings the transfer fluid into the thermal riser can be coupled. In one configuration, the part may be manifold 450. Manifold 450 includes a transfer fluid flow path 455, which directs transfer fluid from an external source into the thermal riser 410 through inlets 460. On the other side, manifold 450 receives the transfer fluid, through outlet 460, the transfer fluid now heated due to contact with the pins 440. O-rings 465 may help create a leak-proof connection between the inlet/outlet 460 and the connection socket 415 of the thermal riser 410.

Figure 5A:
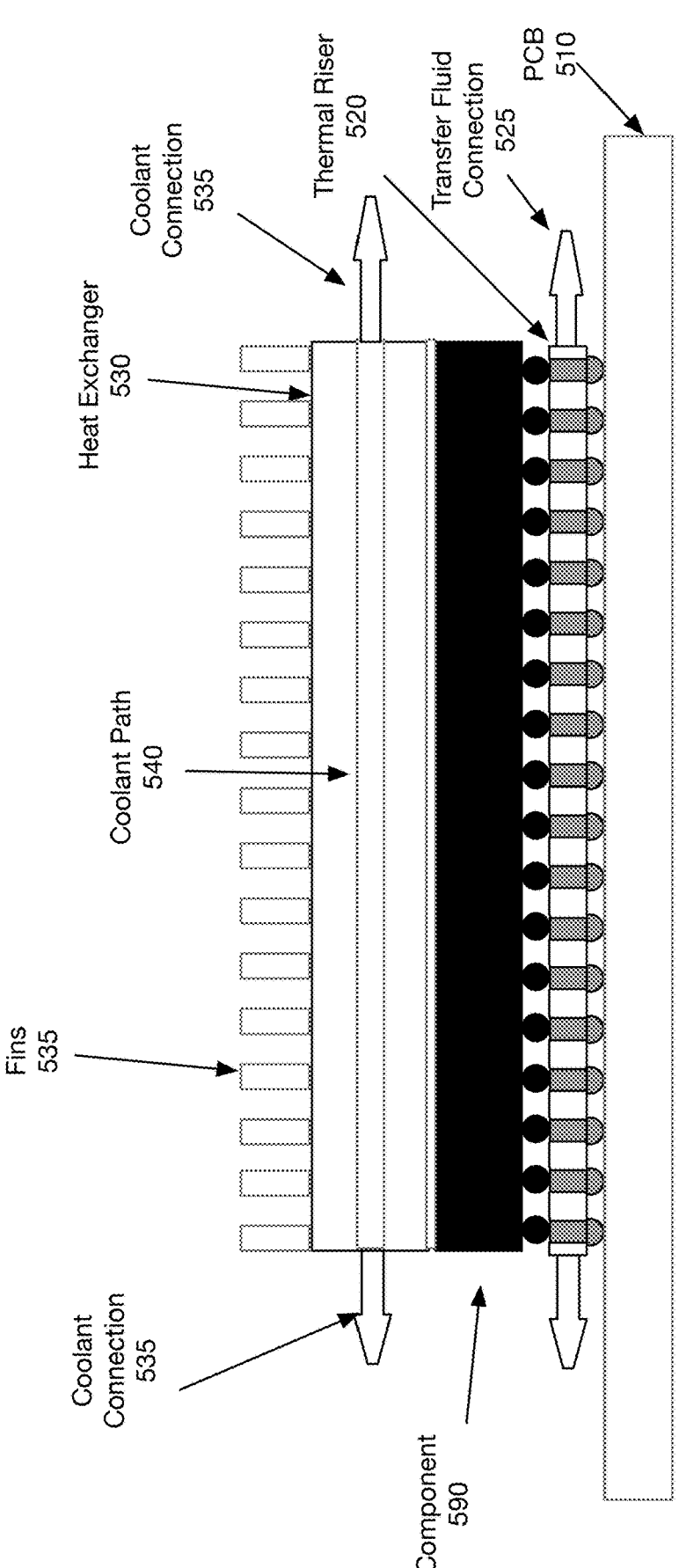
FIG. 5A is a diagram of a thermal riser paired with an optional heat exchanger.
Figure 5B:
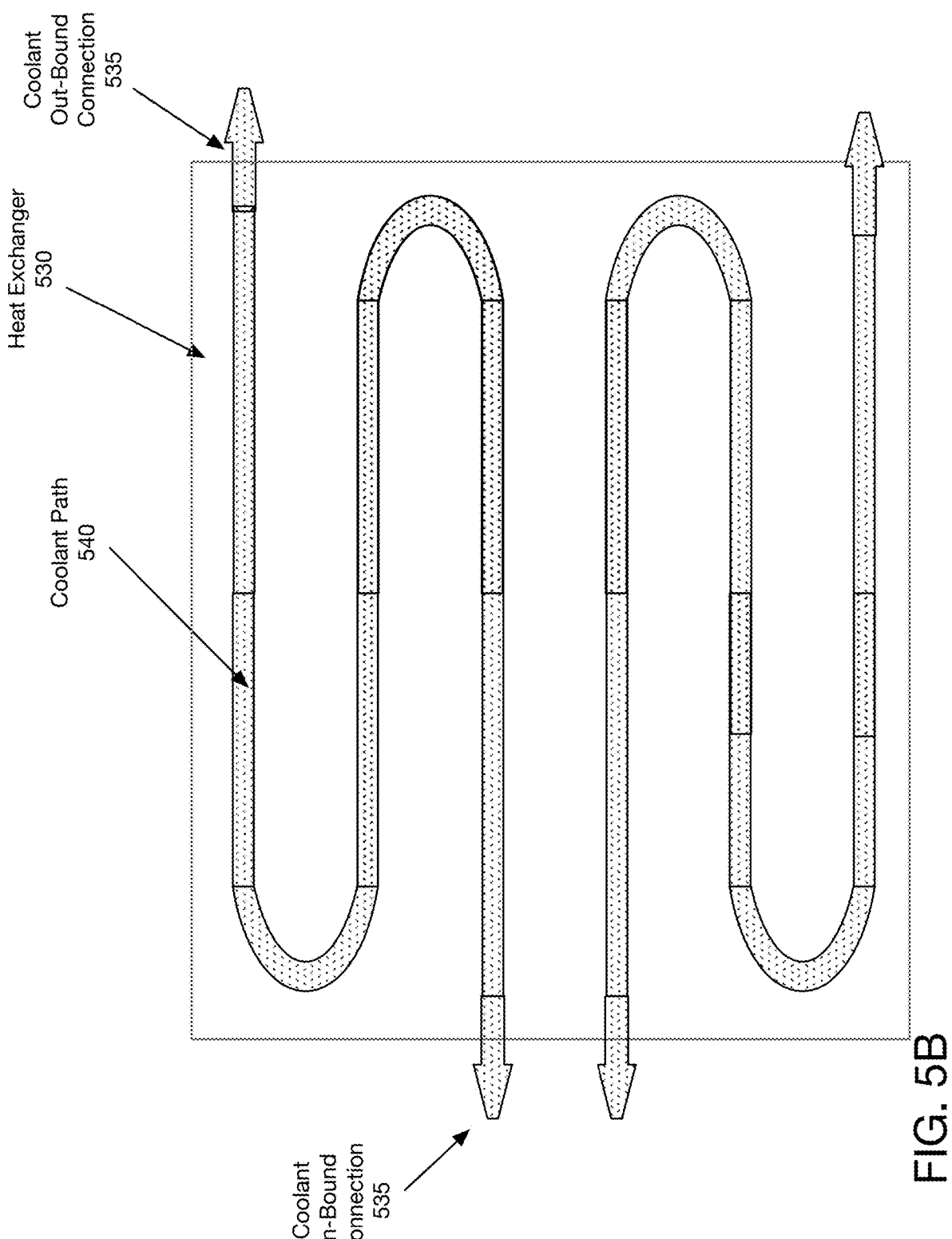
FIG. 5B is a diagram of an exemplary configuration of the heat exchanger shown with a transparent top portion, showing the coolant path.

FIG. 5A is a diagram of a thermal riser paired with an optional heat exchanger. In various embodiments, the thermal riser 520, designed to cool the pins and thus the bottom of the component 590 on the PCB 510, is paired with a heat exchanger 530 to cool the top of the component 590. The heat exchanger 530 includes coolant path 540, to carry a coolant, and optionally fins 535 or other components to increase the amount of heat that can be shed by the heat exchanger 530. The coolant path 540 may be coolant tubing or passages milled into the enclosure. The coolant used in the heat exchanger 530 does not come into contact with any part of the component 590 and thus does not need to be electrically non-conductive and may be any material that is heat conductive. For example, water may be used in heat exchanger coolant path 540. As shown in FIG. 5B, the coolant path 540 may in various embodiments be looped or otherwise lead through the heat exchanger 530 to maximize cooling of the component 590. As illustrated in FIG. 5A, the transfer fluid in thermal riser 520 is separate from the coolant in the heat exchanger 530's coolant path 540. The transfer fluid may also flow through the thermal riser 520 in various embodiments, through transfer fluid connections 525.

FIG. 5B is a diagram of an exemplary configuration of the heat exchanger shown with a transparent top portion, showing an exemplary layout of the coolant path. In this example, the coolant path 540 is laid out in double S-shape, in which the coolant enters the heat exchanger 530 at the center portion and exits on the edges. The configuration of the coolant path may be altered, for example for simplicity, manufacturing, and/or efficiency reasons.

Figure 6:
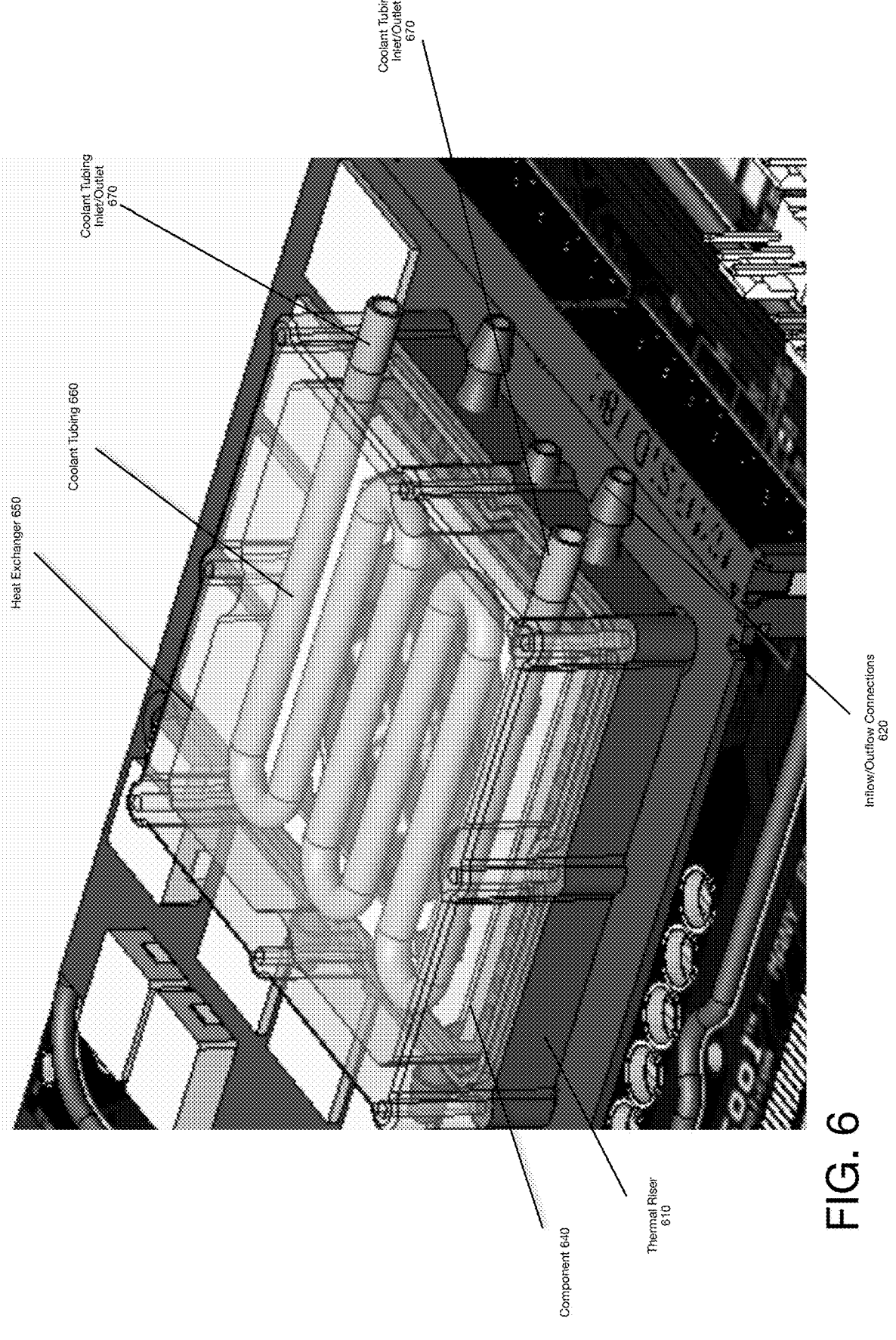
FIG. 6 is a perspective view of an exemplary configuration of the system including the thermal riser and the heat exchange, with the casing of the heat exchanger shown as transparent.

FIG. 6 is a perspective view of an exemplary configuration of the system including the thermal riser 610 and the heat exchanger 650, with the casing of the heat exchanger shown as transparent. In this exemplary configuration, the coolant tubing 660 in the heat exchanger 650 is a serpentine shape. In the example shown in FIG. 5A, the coolant tubing 660 is in an S-shape, having a single inlet and a single outlet 670. Other shapes may be used, such as spirals, petals, etc.

The specific layout of the coolant tubing 660 is not limiting. In the illustrated configuration, the thermal riser 610 includes inflow and outflow connections 620 for the thermal fluid. The component 640 can be seen above the thermal riser 610. The heat exchanger 650 forms a "lid" for the thermal riser 610 and provides additional cooling for the thermal fluid which is contained within the system formed by the thermal riser 610 and the heat exchanger 650. The coolant in the coolant tubing 660 may be another material, such as water, air, oil, etc., since it is isolated from the thermal fluid in the heat exchanger 650.

Figure 7:
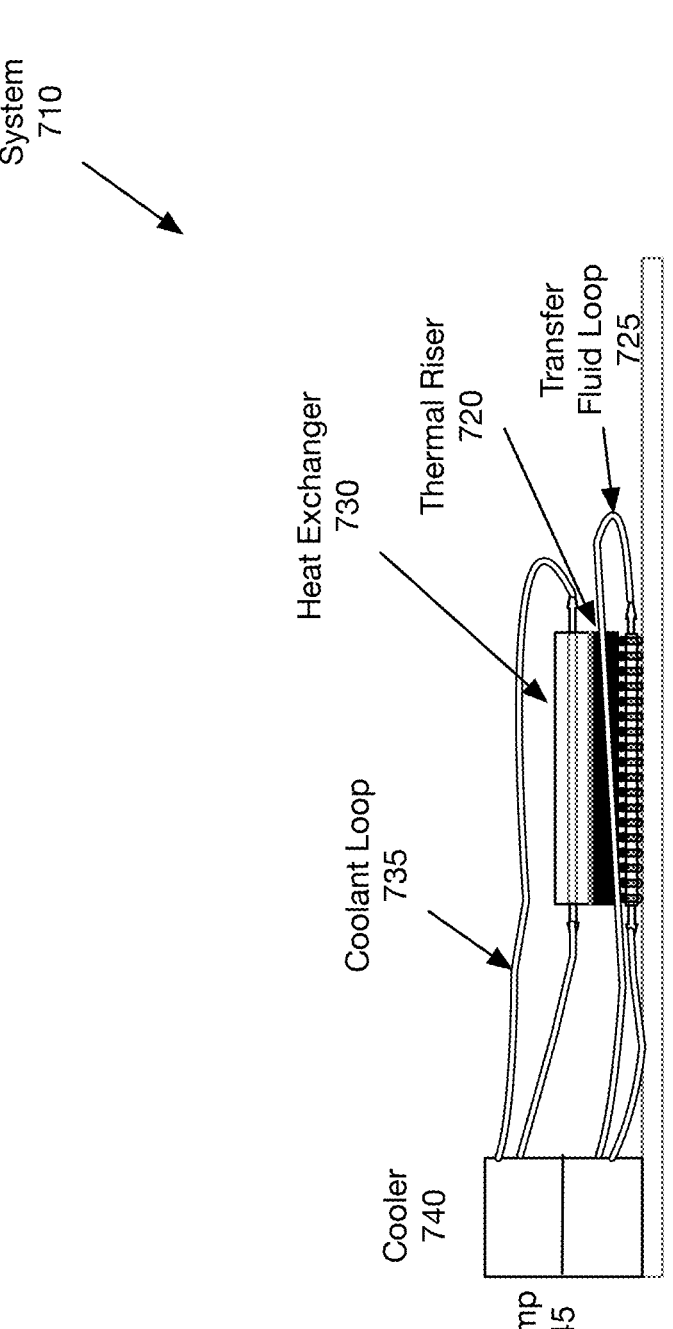
FIG. 7 illustrates a configuration of the system including the cooler, showing the flow of cooling fluid in the thermal riser and the heat exchanger.

FIG. 7 illustrates a configuration of the system including the cooler, showing the flow of cooling fluid in the thermal riser and the heat exchanger. The thermal riser system 710 includes the thermal riser 720, the heat exchanger 730, and the cooler 740. The transfer fluid circulates within the thermal riser 720 and transfer fluid loop 725. The transfer fluid loop 725 carries the hot transfer fluid from the thermal riser 720 to cooler 740 and returns the cooled transfer fluid to the thermal riser. Similarly, the coolant loop 735 circulates the coolant through heat exchanger 730 and cooler 740. Although the illustration shows a single component dual cooler, in other implementations there may be separate cooler systems for the coolant and the transfer fluid. In various embodiments, the cooler 740 may be remote from the printed circuit board, placed somewhere else within a chassis holding the printed circuit board. Cooler 740 may be a mechanical structure such as a heatsink, through which the heated material is passed for cooling, a radiator, a Peltier cooler, a reservoir, a thermoelectric cooler, or another type of cooler. The system may further include pumps 745, to move the transfer fluid through the transfer fluid loop 725, and/or coolant through the coolant loop 735. The pump may be a piezo pump, a circulation pump, or another type of pump. It may be located in cooler 735, within the thermal riser or heat exchanger, or in another location along the loops.

Figure 8A:
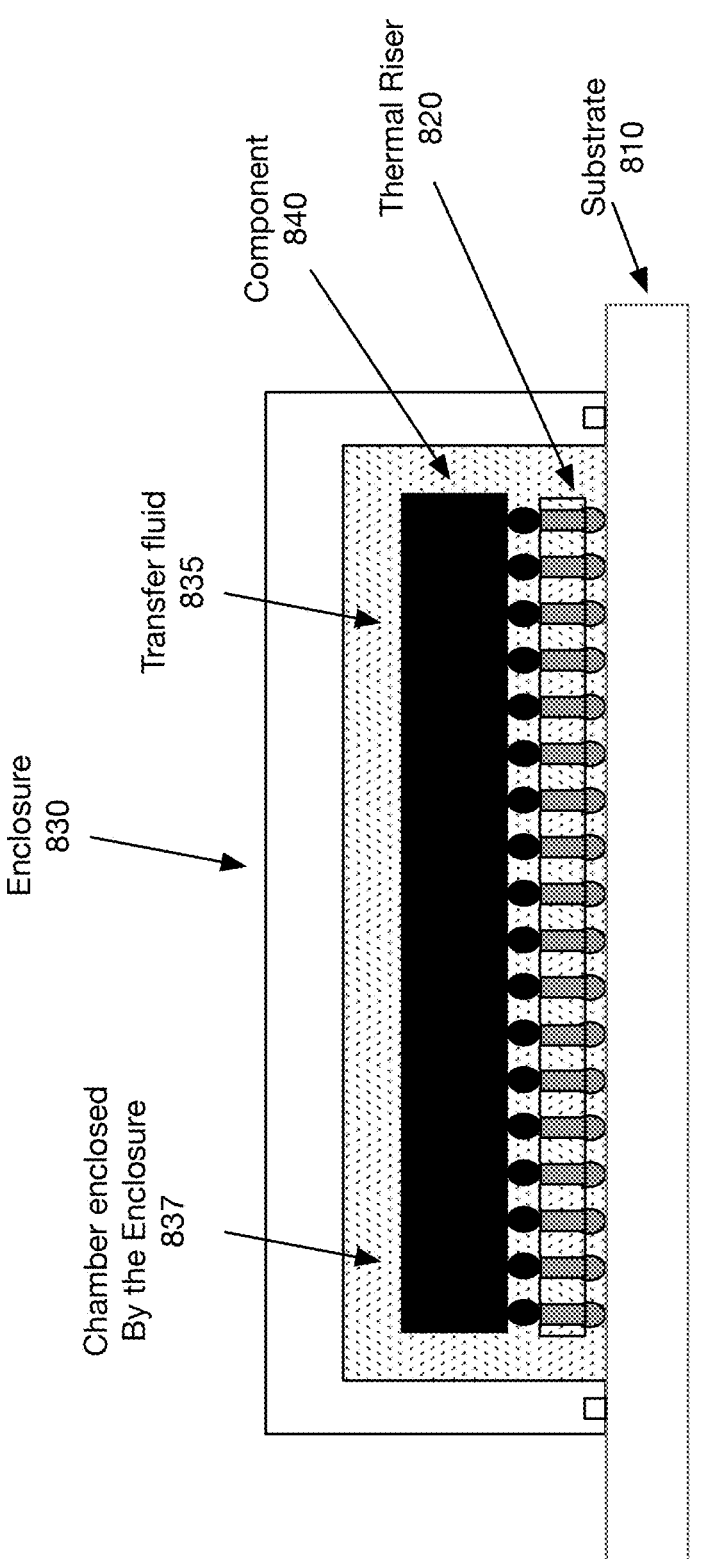
FIG. 8A illustrates a configuration of the system including an enclosure providing fluid cooling for the component, in combination with the thermal riser.

FIG. 8A illustrates a configuration of the system including an enclosure providing fluid cooling for the component, in combination with the thermal riser. In this configuration, instead of a sealed thermal riser 820 with its attendant risk of leakage, the thermal riser 820 and the component 840 are enclosed within an enclosure 830 sealed to a substrate 810. A gasket may be used to provide leak-proof sealing of the enclosure 830 to the substrate 810. The chamber 837 of the enclosure is filled with the transfer fluid 835 which flows through the thermal riser 820 as well. In this configuration, the transfer fluid moves within the chamber 837 through convection, as the heated transfer fluid rises to the top of the enclosure and radiates heat. The enclosure 830 may include heatsink features such as fins or fingers or a radiant material. The thermal riser 820 in this configuration may be open, supported by two sides, partial sides, corner supports, or another configuration allowing the thermal fluid to flow through the thermal riser 820 freely.

Figure 8B:
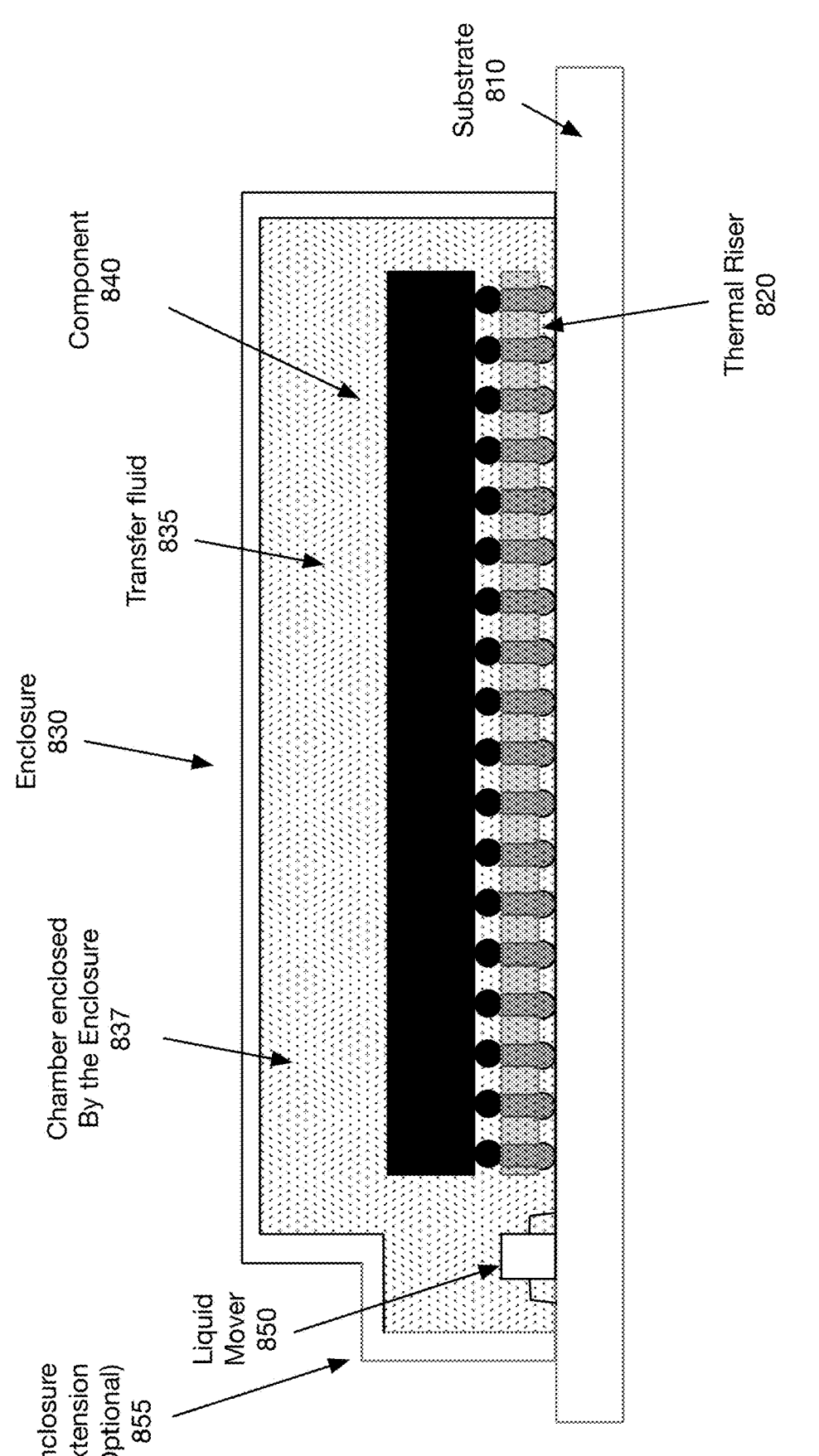
FIG. 8B illustrates a configuration of the system including an enclosure with a pump for moving the transfer fluid within the enclosure.

FIG. 8B illustrates a configuration of the system including an enclosure with a liquid mover for moving the transfer fluid within the enclosure. In various embodiments, the movement of the transfer fluid 835 within the chamber 837 may be improved using a liquid mover 850. The thermal riser 820 in this configuration may be open as well. The liquid mover 850 may be for example an integrated micropump to actively circulate the transfer fluid, a vibration motor within the sealed chamber created by the extended heatsink to create mechanical agitation, a small submerged fan or propeller, a thermoelectric cooler (TEC) within the extended heatsink to create a temperature gradient, promoting fluid movement through thermal cycling, a speaker to generate acoustic waves, a piezoelectric buzzer to create ultrasonic vibrations, a piezoelectric buzzer, a piezoelectric diaphragm pump, or another structure for promoting the movement of the transfer fluid. The system may further include a sensor (not shown) to control the liquid mover 850. In some configurations, the enclosure 830 may be shaped to accommodate the liquid mover 850. For example, the chamber may have an optional extension 855 to provide space for the liquid mover 850.

Figure 8C:
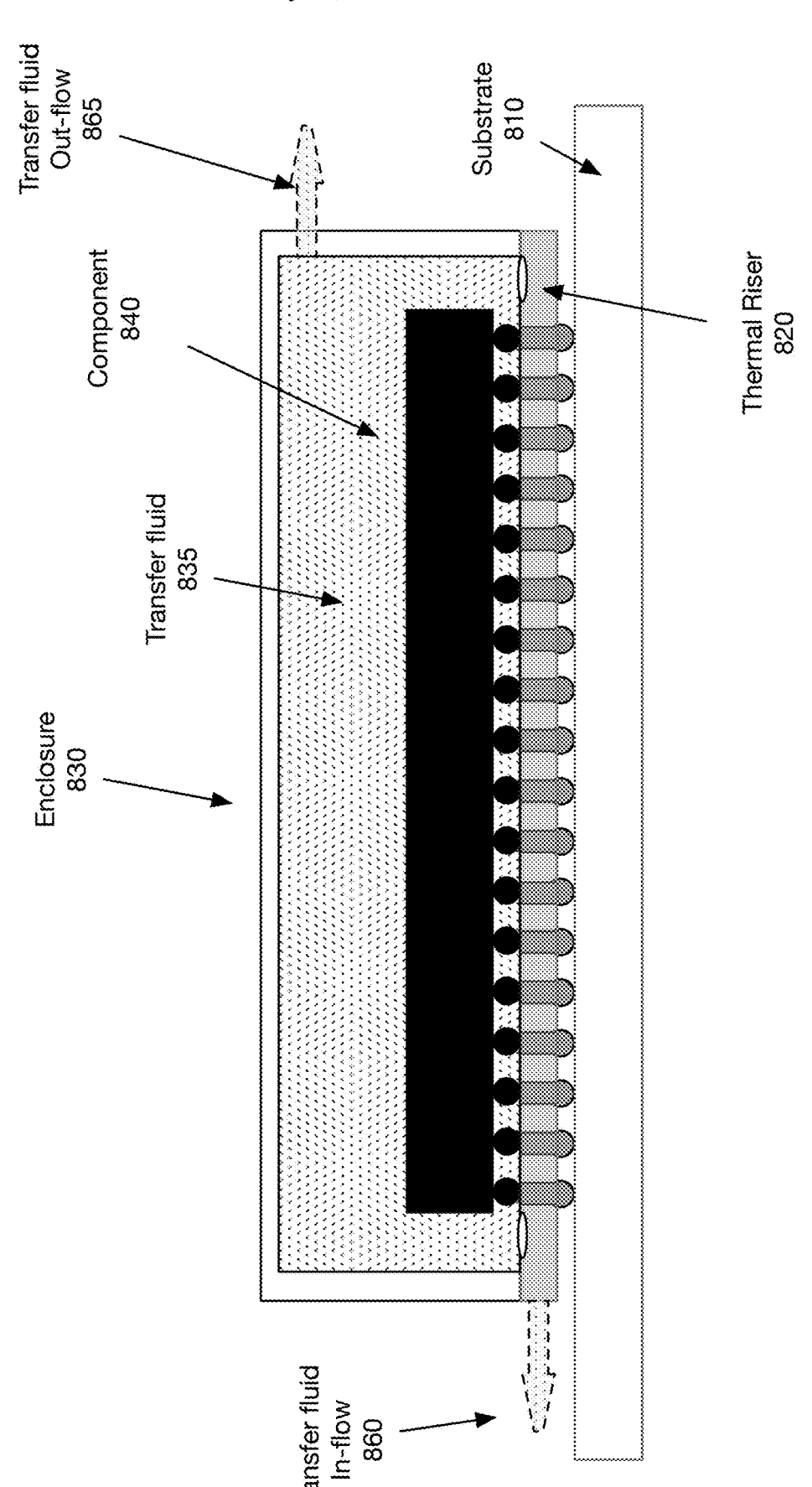
FIG. 8C illustrates a configuration of the system including an enclosure providing heat transfer for the component, with an in-flow for the transfer fluid through the thermal riser.

FIG. 8C illustrates a configuration of the system including an enclosure providing fluid cooling for the component, with an inflow 860 for the transfer fluid through the thermal riser, and an outflow 865 through the enclosure 830. In this configuration, the enclosure 830 includes a transfer fluid in-flow 860 and out-flow 865 mechanism. Rather than circulating the transfer fluid within the enclosure, the transfer fluid enters the enclosure at in-flow points 860 and exits at out-flow points 865. The transfer fluid is then cooled outside the enclosure 830 by a cooler (not shown), before circulating back to the in-flow 860. In this configuration, the enclosure 830 is sealed to the thermal riser 820 and not the substrate 810. In this configuration, the thermal riser 820 may be partially open on its top surface, allowing the transfer fluid 835 to circulate through the thermal riser. In another embodiment, the thermal riser 820 may have one or more holes in the top of the thermal riser 820 to allow the transfer fluid to circulate through the enclosure 830 and thermal riser 820.

Figure 8D:
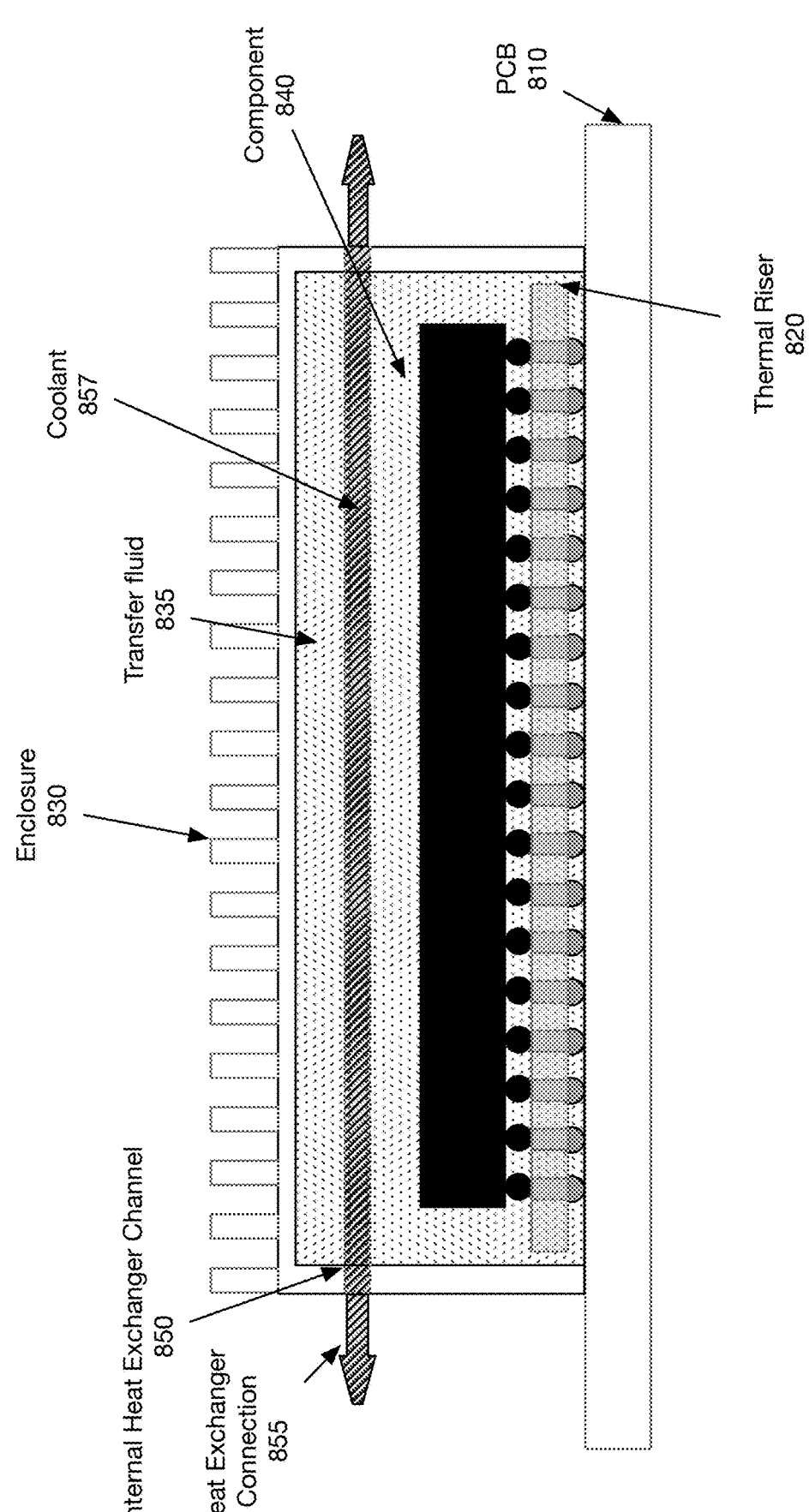
FIGS. 8D and 8E illustrate a configuration of the system including an enclosure providing fluid cooling for the component, with a heat exchanger tubing, in combination with the thermal riser.
Figure 8E:
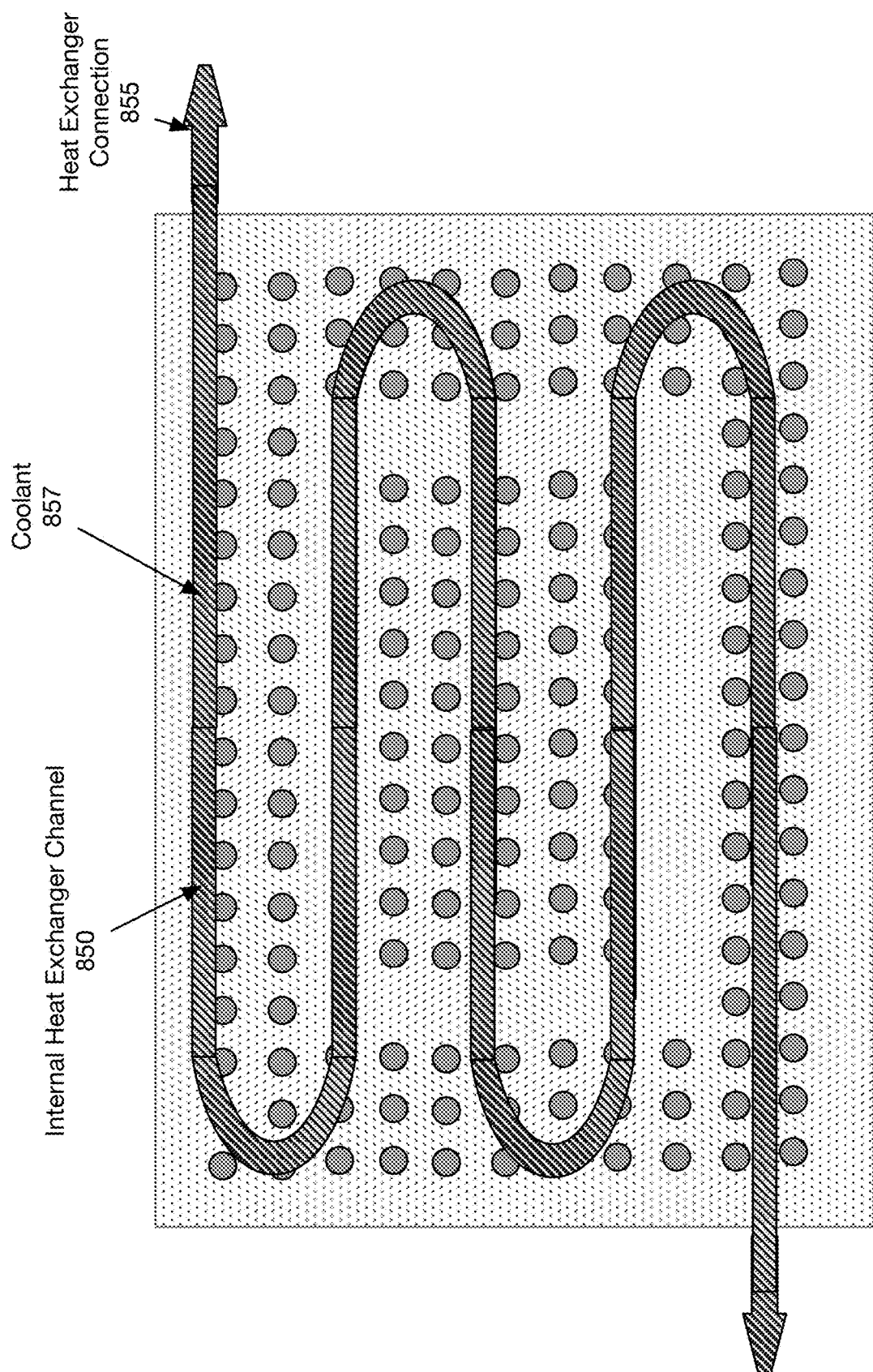

FIGS. 8D and 8E illustrate a configuration of the system including an enclosure providing fluid cooling for the component, with a heat exchanger tubing, in combination with the thermal riser. In this configuration, in addition to the transfer fluid circulating through the enclosure 830 and thermal riser 820, there is a heat exchanger channel 852, which passes through the enclosure. The heat exchanger channel 852 provides cooling of the transfer fluid within the enclosure 830. The heat exchanger channel 852 is sealed, and thus any coolant 857 may be used within the heat exchanger channel 852. In various configurations, water, oil, air, or a combination of these and/or some other liquids or gases to act as the coolant may be used for coolant 857 for the heat exchanger channel. The heat exchanger channel 852 may be tubing, a channel in the enclosure 830, or another material allowing the coolant to flow through the enclosure. The coolant 857 may be cooled outside the enclosure by cooler (not shown).

Figure 8F:
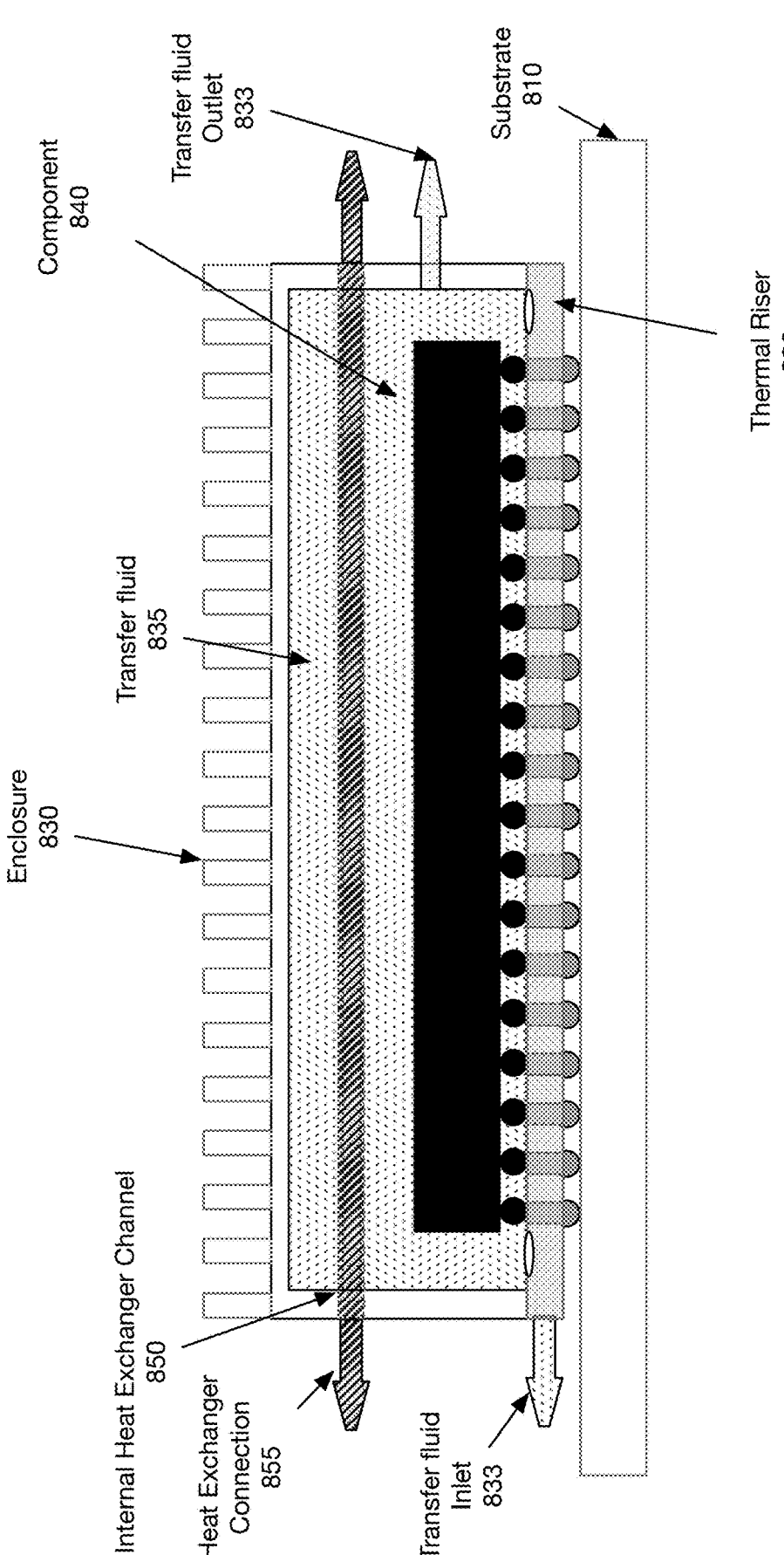
FIGS. 8F and 8G illustrate a configuration of the system including an enclosure, heat exchanger tubing, and transfer fluid flow.
Figure 8G:
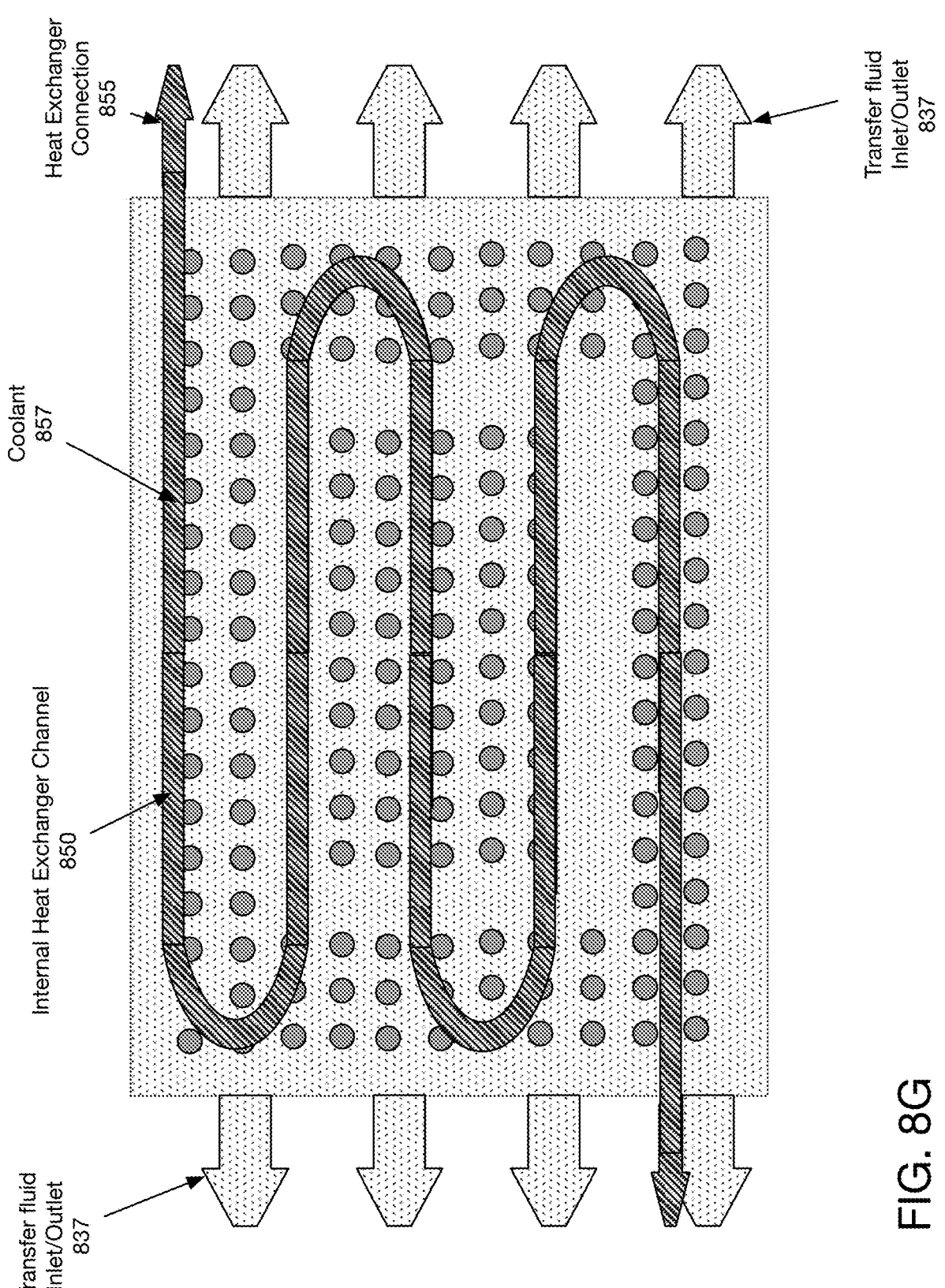

FIGS. 8F and 8G illustrate a configuration of the system including an enclosure, heat exchanger channel, and transfer fluid flow. In this configuration, in addition to the heat exchanger channel 852, the system includes a transfer fluid inlet/outlet 833 which permits the transfer fluid to circulate to a cooler outside the enclosure. In various configurations, the transfer fluid inlet/outlet 833 may enter the enclosure through thermal riser 820 and exit through another portion of the enclosure. This configuration provides two cooling loops, as in FIG. 7.

Figure 9A:
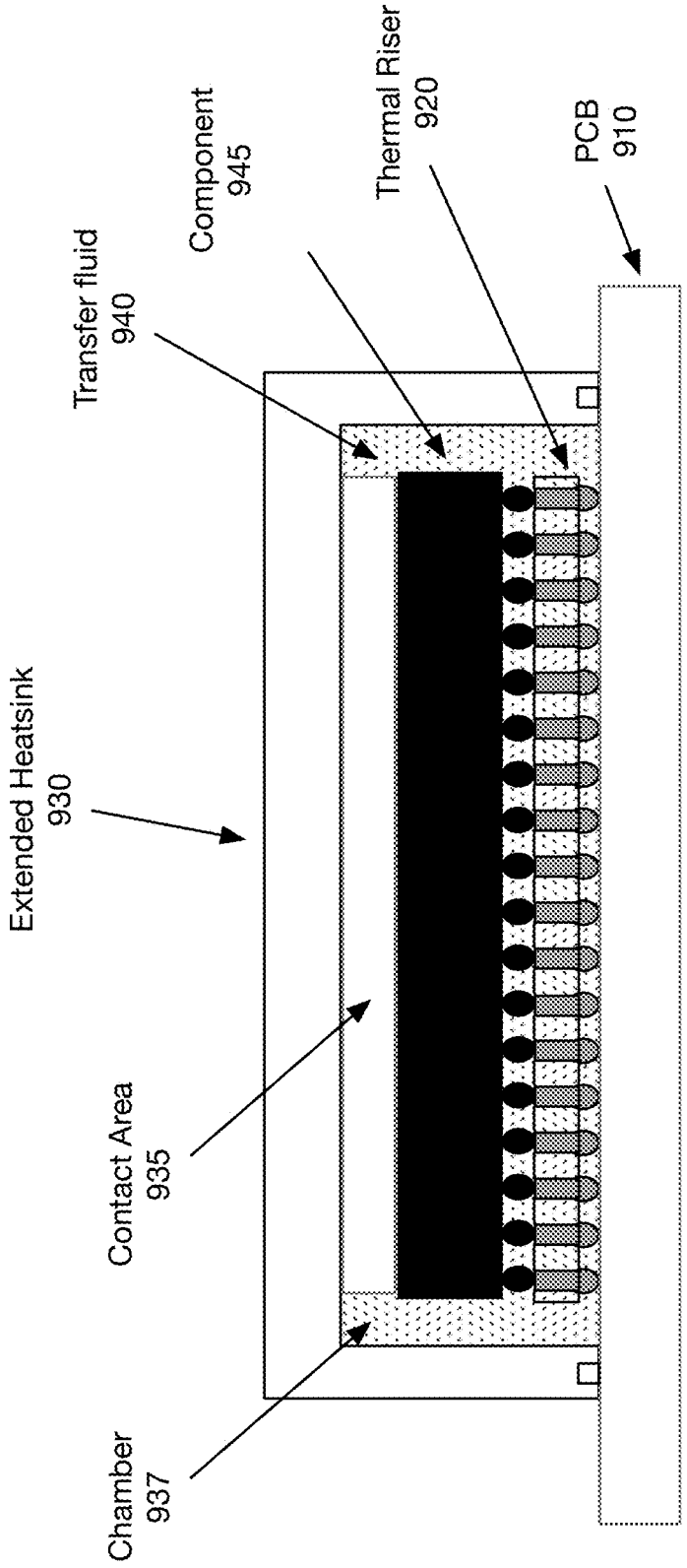
FIG. 9A illustrates a configuration of the system including an extended heatsink providing contact cooling and fluid cooling for the component, in combination with the thermal riser.

FIG. 9A illustrates a configuration of the system including an extended heatsink providing contact cooling and fluid cooling for the component, in combination with the thermal riser. In this configuration, the enclosure comprises an extended heatsink 930 which encloses the component 945 and thermal riser 920. The extended heatsink 930 includes a heat sink portion which has a contact area 935 in physical contact with a top of the component 945, and a skirt extending from the heatsink portion to the substrate 910 to form a leakproof chamber 937. The leakproof chamber 937 is filled with transfer fluid 940, which circulates through the chamber 937 and the enclosed thermal riser 920. Although not illustrated, a fluid mover may be included in the extended heatsink 930, to move the transfer fluid around the chamber 937.

Figures 9B, 9C:
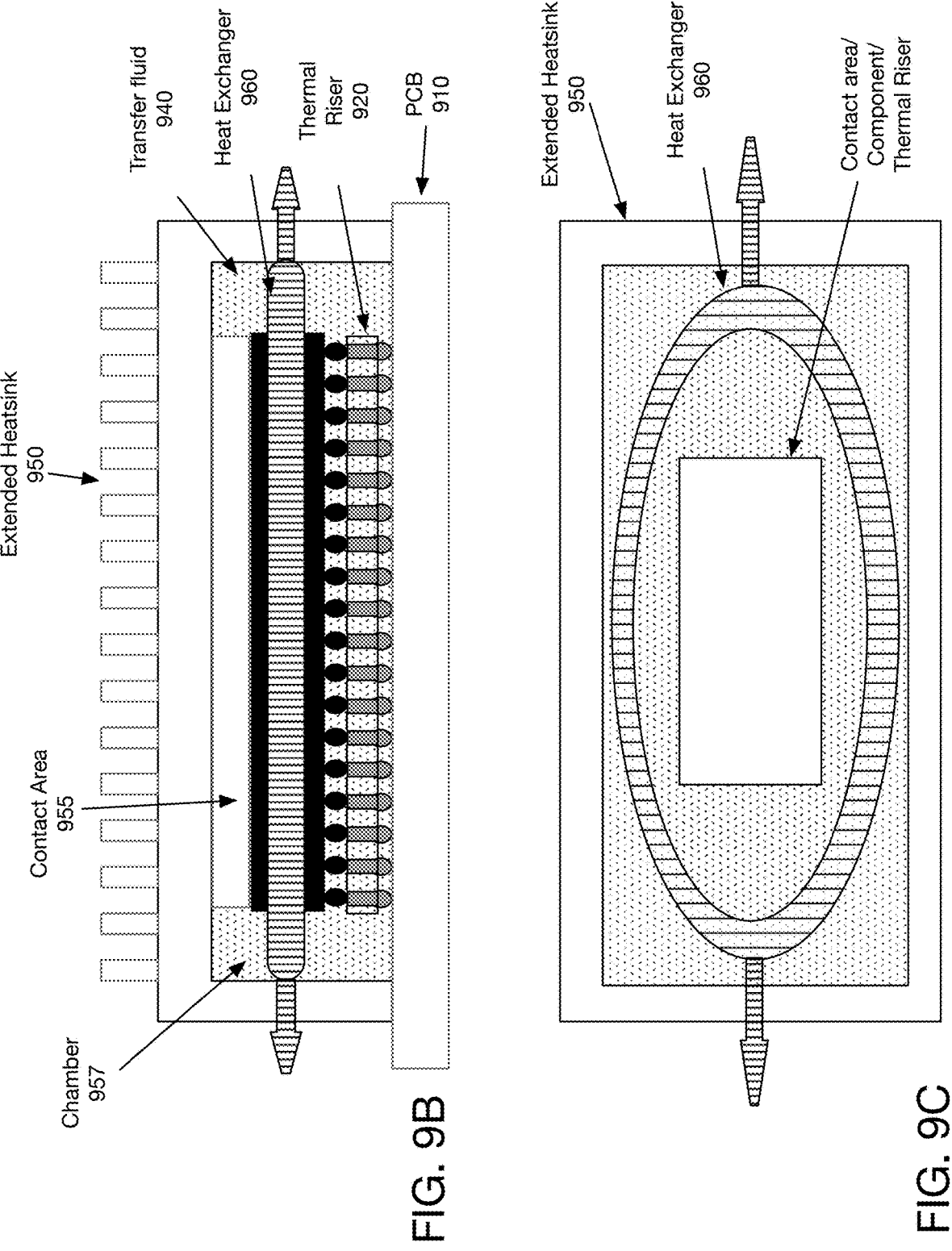
FIGS. 9B and 9C illustrate a configuration of the system including an extended heatsink providing contact cooling and fluid cooling for the component, and a heat exchanger within the enclosure, in combination with the thermal riser.

FIGS. 9B and 9C illustrate a configuration of the system including an extended heatsink providing contact cooling and fluid cooling for the component, and a heat exchanger within the enclosure, in combination with the thermal riser. In this configuration, the extended heatsink 950 operates as the enclosure and encloses, in addition to the thermal riser 920 and component, a heat exchanger 960. The heat exchanger 960 circulates a coolant within a coolant path through the chamber 957, that is in contact with the transfer fluid. The shape of the heat exchanger 960 may vary. The extended heatsink 950 includes a contact area 955, which provides contact cooling in addition to the liquid cooling provided by transfer fluid 940 within the chamber 957 formed by the enclosure of the extended heatsink 950. The coolant path may be a coolant tube around the contact area, as shown in FIG. 9C, in various embodiments. The coolant path may be passages through a portion of the enclosure, a portion of the contact area 955, or a combination of passages and tubing. In various embodiments, the coolant path may travel through the contact area 955 of the extended heatsink 950.

Figures 9D, 9E:
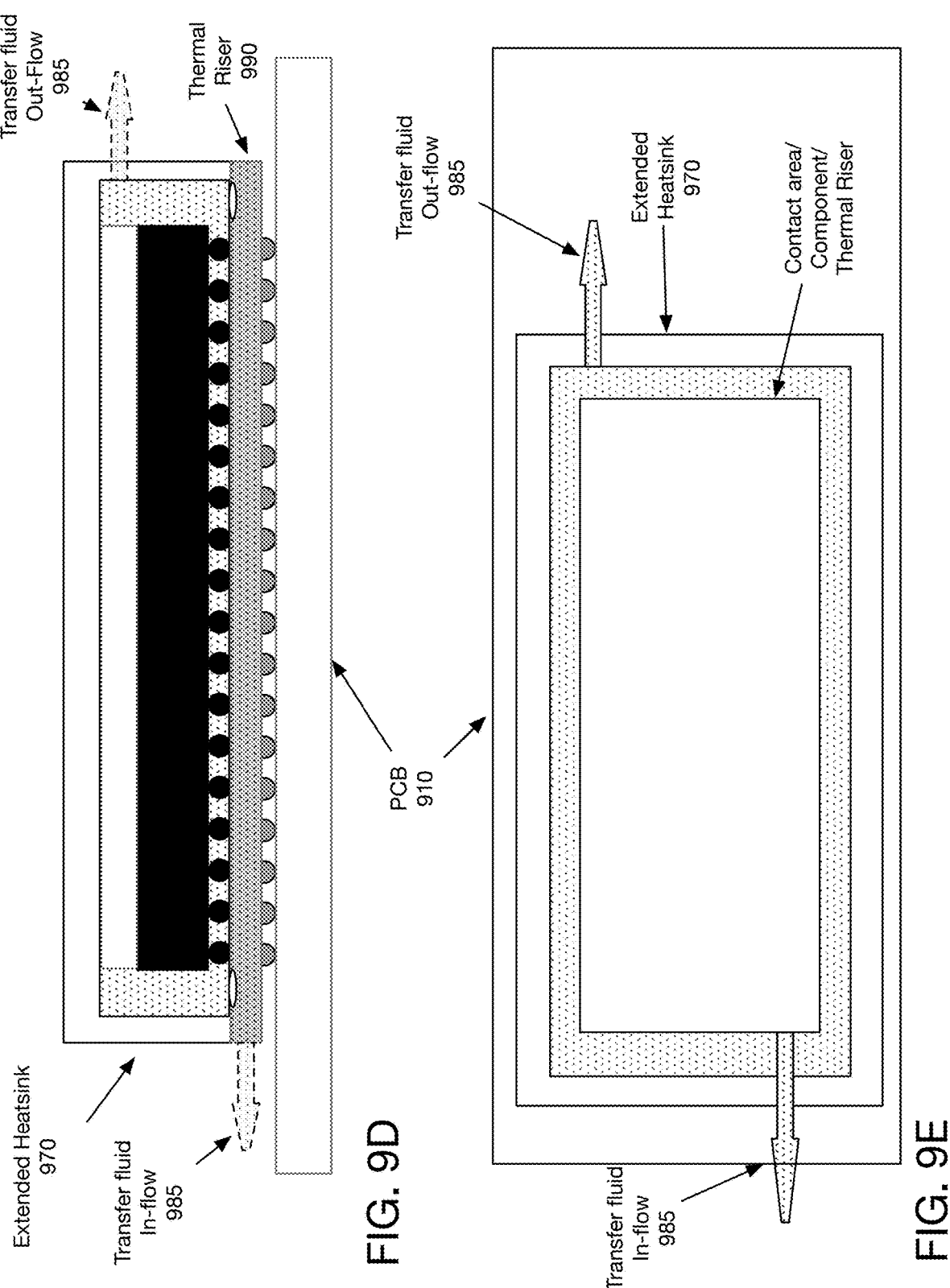
FIGS. 9D and 9E illustrate a configuration of the system including an extended heatsink providing contact cooling and fluid cooling for the component, in combination with the thermal riser having an outflow for the transfer fluid through the thermal riser.

FIGS. 9D and 9E illustrate a configuration of the system including an extended heatsink providing contact cooling and fluid cooling for the component, in combination with the thermal riser having an in-flow for the transfer fluid through the thermal riser. In this configuration, the transfer fluid circulates outside the enclosure, for cooling. The thermal riser 990 has an extended heatsink 970 sealed to it and transfer fluid circulating through the interior chamber and the thermal riser 990. The transfer fluid in-flow 985 is through the thermal riser 990 in various configurations, while the transfer fluid out-flow 985 is through the extended heatsink 970.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

We claim:

1. A cooling system for a component on a substrate comprising a thermal riser, the thermal riser comprising:

a thermal riser casing;

a plurality of pins extending through the thermal riser casing, the pins having a top comprising a plurality of thermal riser pads to receive interconnection pins on a bottom of the component, and a plurality of thermal riser solder balls are configured to be coupled to pads on the substrate;

the pins coupling each of the plurality of thermal riser pads to a corresponding thermal riser solder ball, the pins being electrically conductive;

a transfer fluid within the thermal riser, the transfer fluid in contact with the pins to cool the interconnection pins of the component and thereby cool the bottom of the component; and a leak-proof enclosure surrounding the thermal riser and the component on the substrate, the leak-proof enclosure filled with the transfer fluid.

2. The cooling system of claim 1, wherein the transfer fluid is thermally conductive and electrically non-conductive.

3. The cooling system of claim 1, further comprising:
a heat exchanger positioned on a top of the component, the heat exchanger cooling the top of the component.

4. The cooling system of claim 3, wherein the heat exchanger and the thermal riser utilize the transfer fluid.

5. The cooling system of claim 1, further comprising a cooler outside the thermal riser to cool the transfer fluid.

6. The cooling system of claim 1, wherein the thermal riser casing is open on one or more sides to enable a flow of the transfer fluid through the thermal riser within the enclosure.

7. The cooling system of claim 1, wherein the leak-proof enclosure comprises an extended heatsink including a contact area that is in physical contact with a top of the component, and a skirt coupled to the substrate to form the leak-proof enclosure.

8. The cooling system of claim 1, further comprising:
a heat exchanger channel through the enclosure, the heat exchanger channel carrying a coolant further to cool the transfer fluid in the enclosure.

9. The cooling system of claim 8, wherein the heat exchanger channel is a heat exchanger tube, and the coolant is cooled outside the enclosure.

10. The cooling system of claim 8, wherein the heat exchanger channel comprises a channel within a material of the enclosure.

11. The cooling system of claim 8, further comprising:
a transfer fluid inflow and a transfer fluid outflow into the enclosure, so that the transfer fluid is cooled outside the enclosure.

12. The cooling system of claim 1, wherein the enclosure is sealed to the substrate.

13. The cooling system of claim 1, wherein the enclosure is sealed to the thermal riser.

14. The cooling system of claim 1, further comprising:
a sealant around each pin in the thermal riser, to keep the transfer fluid from leaking.

15. The cooling system of claim 14, wherein the sealant comprises a potting compound on a top of the thermal riser casing, and a bottom of the thermal riser casing.

16. The cooling system of claim 1, further comprising:
a positioning fastener to position the thermal riser on the substrate.

17. The cooling system of claim 1, further comprising:
an in-bound transfer fluid connection; and
an out-bound transfer fluid connection, the transfer fluid circulating between the in-bound transfer fluid connection and the out-bound transfer fluid connection.

18. The cooling system of claim 17, further comprising:
a cooler to cool the transfer fluid outside the thermal riser.

19. A thermal riser for a component on a printed circuit board comprising:
a thermal riser casing having a top and a bottom;
a plurality of pins extending through the thermal riser casing and extending from the thermal riser casing on the top and the bottom;
the thermal riser configured to be placed between the component and the printed circuit board, the thermal riser to provide an electrical connection between the component and the printed circuit board;
transfer fluid in the thermal riser casing to cool the plurality of pins, and thereby the component coupled to the pins;
a leak-proof enclosure surrounding the thermal riser and the component on the printed circuit board, the leak-proof enclosure filled with the transfer fluid.

20. A thermal management system for a component on a substrate comprising:
a thermal riser including a plurality of pins, the thermal riser configured to be placed between the component and the substrate, the pins in the thermal riser configured provide electrical connections between the component and the substrate;
a leak-proof enclosure surrounding the thermal riser and the component on the substrate; and
transfer fluid in the leak-proof enclosure and the thermal riser to cool the component.

21. The thermal management system of claim 20, wherein the thermal riser is open on one or more sides to enable a flow of the transfer fluid through the thermal riser within the enclosure.

22. The thermal management system of claim 20, further comprising:
a heat exchanger channel through the enclosure, the heat exchanger channel carrying a coolant further to cool the transfer fluid in the enclosure.

* * * * *